(12) United States Patent
Karda et al.

(10) Patent No.: US 12,432,898 B2
(45) Date of Patent: Sep. 30, 2025

(54) MEMORY DEVICE HAVING TIERS OF 2-TRANSISTOR MEMORY CELLS

(71) Applicant: Micron Technology, Inc., Boise, ID (US)

(72) Inventors: Kamal M. Karda, Boise, ID (US); Durai Vishak Nirmal Ramaswamy, Boise, ID (US); Haitao Liu, Boise, ID (US); Karthik Sarpatwari, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 133 days.

(21) Appl. No.: 18/521,273

(22) Filed: Nov. 28, 2023

(65) Prior Publication Data

US 2024/0188273 A1 Jun. 6, 2024

Related U.S. Application Data

(60) Provisional application No. 63/429,784, filed on Dec. 2, 2022.

(51) Int. Cl.
*G11C 11/34* (2006.01)
*G11C 11/405* (2006.01)
(Continued)

(52) U.S. Cl.
CPC ............ *H10B 12/00* (2023.02); *G11C 11/405* (2013.01); *G11C 11/4096* (2013.01)

(58) Field of Classification Search
CPC .... H10B 12/00; G11C 11/405; G11C 11/4096
(Continued)

(56) References Cited

U.S. PATENT DOCUMENTS

| 7,126,154 B2 * | 10/2006 | Rosskopf | ............... | H10B 12/05 |
| | | | | 257/E21.654 |
| 7,940,595 B2 * | 5/2011 | Kurjanowicz | ....... | G11C 29/027 |
| | | | | 365/49.1 |

(Continued)

FOREIGN PATENT DOCUMENTS

| KR | 20190100448 | 8/2019 |
| WO | 2024118599 | 6/2024 |

OTHER PUBLICATIONS

"International Application Serial No. PCT US2023 081338, International Search Report mailed Apr. 2, 2024", 3 pgs.
(Continued)

*Primary Examiner* — Viet Q Nguyen
(74) *Attorney, Agent, or Firm* — Schwegman Lundberg & Woessner, P.A.

(57) ABSTRACT

Some embodiments include apparatuses and methods of using the apparatuses. One of the apparatuses includes first, second, and third conductive structures, each having a length in a first direction, first and second memory cells spaced apart from each other in a second direction perpendicular to the first direction, first conductive regions, and second conductive regions. Each of the first and second memory cells includes a first semiconductor portion located on a first level of the apparatus and coupled to the third conductive structure and one of the first and second conductive structures, a second semiconductor portion located on a second level of the apparatus and coupled to one of the first and second conductive structures. The first conductive regions are opposite the first and second semiconductor portions, respectively, of the first memory cell. Second conductive regions are opposite the first and second semiconductor portions, respectively, of the second memory cell.

30 Claims, 12 Drawing Sheets

(51) Int. Cl.
  *G11C 11/4096* (2006.01)
  *H10B 12/00* (2023.01)
(58) Field of Classification Search
  USPC .......................................................... 365/184
  See application file for complete search history.

(56) References Cited

U.S. PATENT DOCUMENTS

| | | | | |
|---|---|---|---|---|
| 8,772,848 B2 * | 7/2014 | Zahurak | ............... | H10B 12/053 |
| | | | | 257/296 |
| 11,016,088 B2 * | 5/2021 | Hoffman | ............ | G01N 27/4146 |
| 11,476,252 B2 * | 10/2022 | Sarpatwari | ........... | H10D 30/689 |
| 11,501,803 B2 * | 11/2022 | Castro | ..................... | H01L 23/50 |
| 11,653,489 B2 * | 5/2023 | Karda | ................... | H10D 62/80 |
| | | | | 257/296 |
| 11,665,880 B2 * | 5/2023 | Karda | ................... | H10B 12/20 |
| | | | | 257/43 |
| 11,688,450 B2 * | 6/2023 | Karda | ................... | H10D 62/80 |
| | | | | 365/174 |
| 11,705,367 B2 * | 7/2023 | Parekh | ............. | H01L 21/76831 |
| | | | | 257/762 |
| 11,776,907 B2 * | 10/2023 | Karda | .................. | G11C 11/404 |
| | | | | 257/296 |
| 11,825,658 B2 * | 11/2023 | Parekh | .................. | H10B 43/35 |
| 11,842,990 B2 * | 12/2023 | Simsek-Ege | ........... | H10B 12/33 |
| 11,871,589 B2 * | 1/2024 | Karda | .................... | H10D 62/80 |
| 12,080,331 B2 * | 9/2024 | Karda | .................. | G11C 11/405 |
| 12,100,454 B2 * | 9/2024 | Fujiki | .................... | H10B 41/10 |
| 12,266,660 B2 * | 4/2025 | Karda | .................. | H10D 30/681 |
| 2006/0013041 A1 | 1/2006 | Lin | | |
| 2019/0295626 A1 | 9/2019 | Ikeda et al. | | |
| 2020/0211602 A1 * | 7/2020 | Karda | .................. | G11C 11/403 |
| 2020/0411080 A1 | 12/2020 | Koya | | |
| 2021/0035995 A1 | 2/2021 | Tanzawa | | |

OTHER PUBLICATIONS

"International Application Serial No. PCT US2023 081338, Written Opinion mailed Apr. 2, 2024", 4 pgs.

* cited by examiner

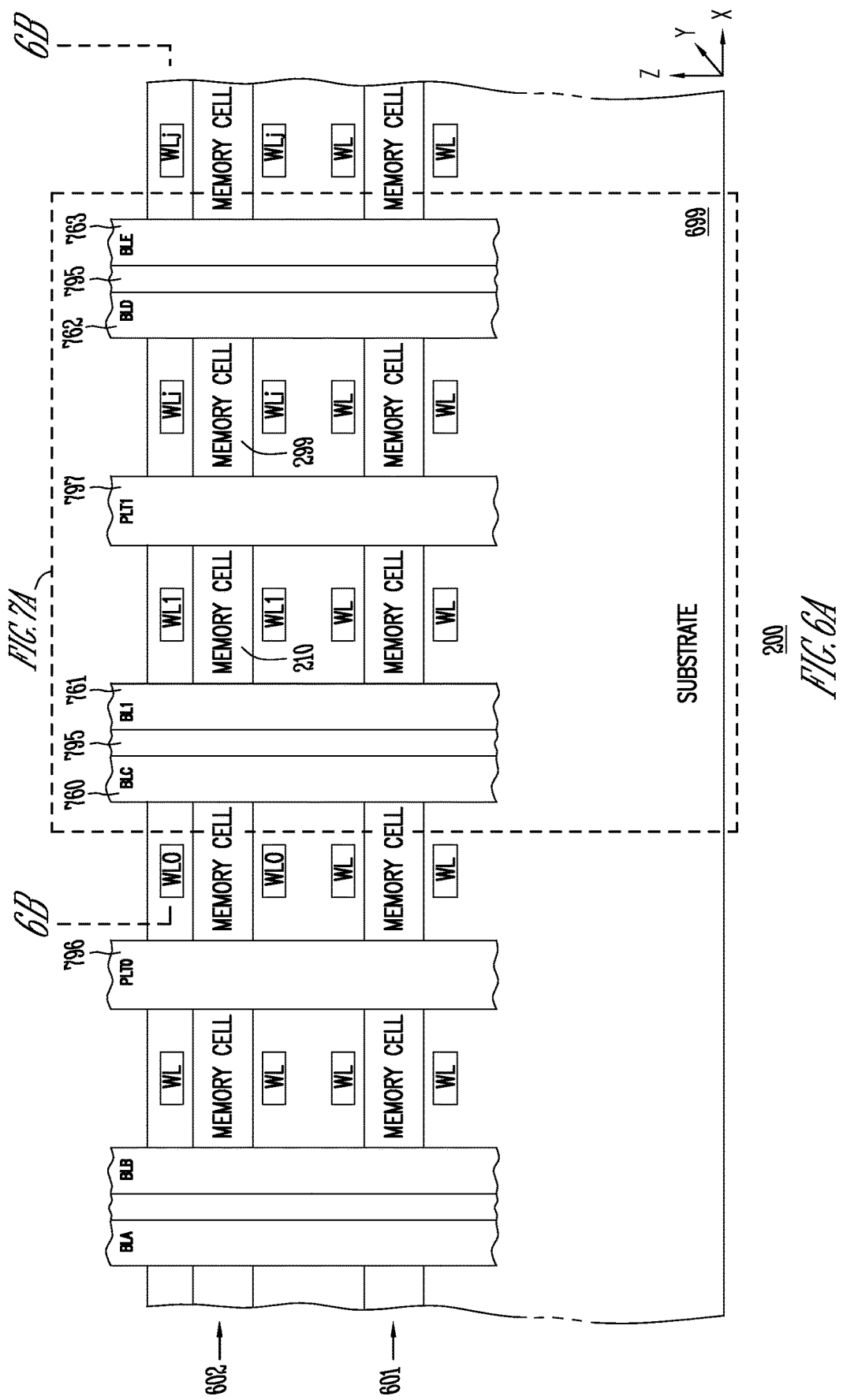

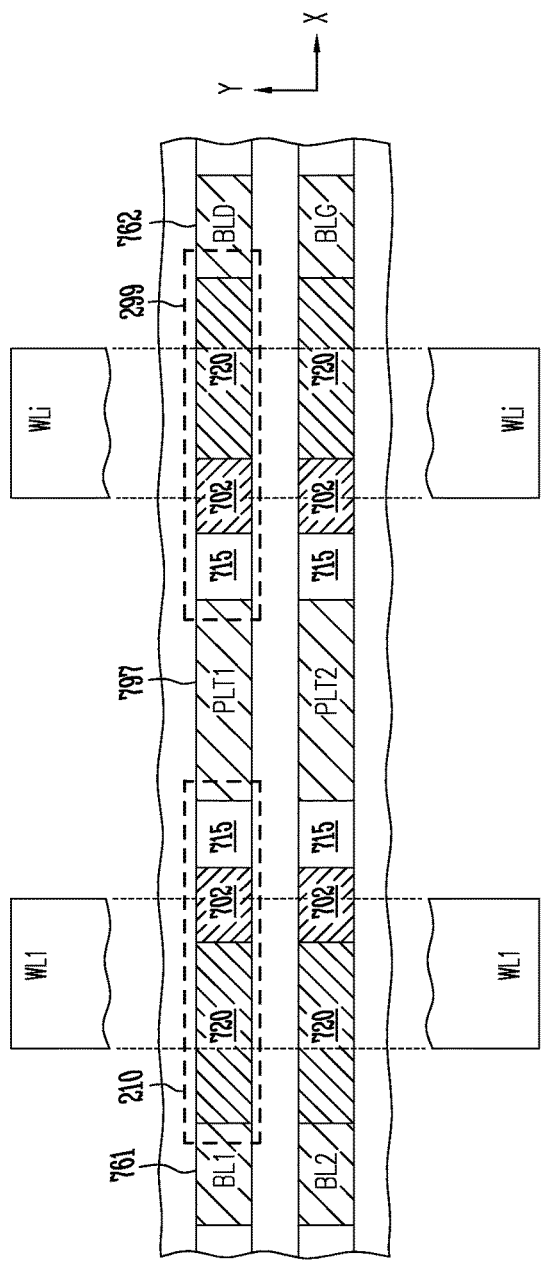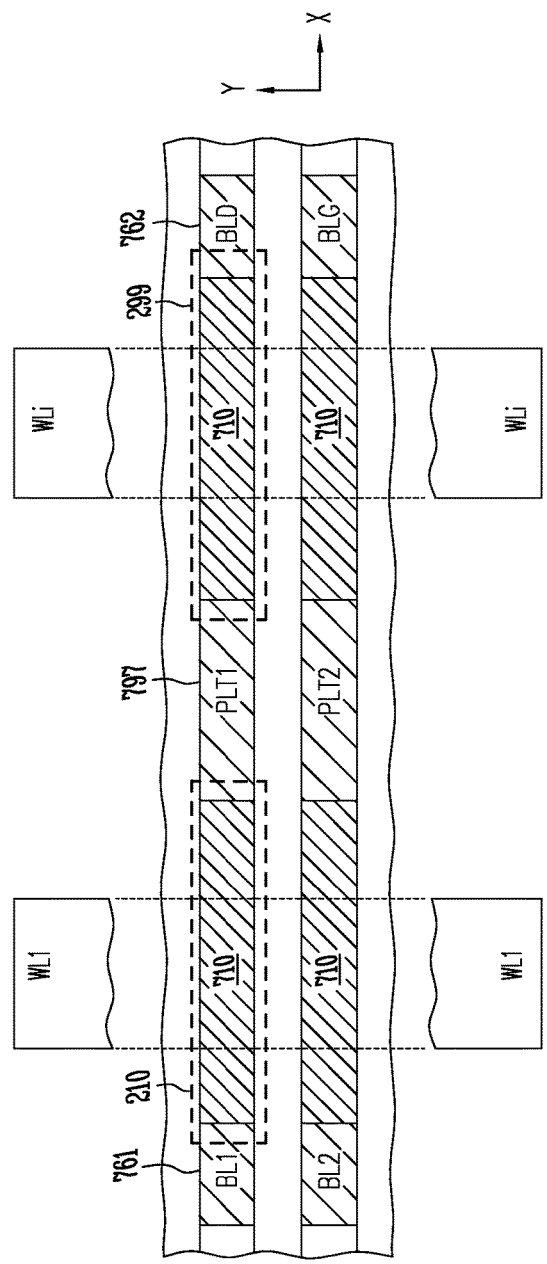

MEMORY DEVICE HAVING TIERS OF 2-TRANSISTOR MEMORY CELLS

PRIORITY APPLICATION

This application claims the benefit of priority to U.S. Provisional Application Ser. No. 63/429,784, filed Dec. 2, 2022, which is incorporated herein by reference in its entirety.

BACKGROUND

Memory devices are widely used in computers and many other electronic items to store information. Memory devices are generally categorized into two types: volatile memory devices and non-volatile memory devices. A memory device usually has numerous memory cells to store information. In a volatile memory device, information stored in the memory cells is lost if supply power is disconnected from the memory device. In a non-volatile memory device, information stored in the memory cells is retained even if supply power is disconnected from the memory device.

The description herein involves volatile memory devices. Most conventional volatile memory devices store information in the form of charge in a capacitor structure included in the memory cell. As demand for device storage density increases, many conventional techniques provide ways to shrink the size of the memory cell in order to increase device storage density for a given device area. However, physical limitations and fabrication constraints may pose a challenge to such conventional techniques if the memory cell size is to be shrunk to a certain dimension.

DETAILED DESCRIPTION

The memory device described herein includes volatile memory cells in which each of the memory cells can include two transistors (2T). One of the two transistors has a charge storage structure, which can form a memory element of the memory cell to store information.

The described memory device includes tiers that are stacked one over another over a substrate (e.g., a semiconductor substrate) of the memory device. Each tier has memory cells and associated access lines (e.g., word lines). The access lines can be structured to include separate conductive regions (e.g., conductive strips) having lengths extending horizontally across memory cells in a respective tier. The access lines in a tier are used to control the transistors of the memory cells in that tier. The conductive regions of the access lines can be configured such that two transistors in a memory cell can be controlled by the same signal provided through the access lines or alternatively by separate signals (e.g., two different signals from two different drivers).

The described memory device includes data lines (e.g., bit lines) that can include conductive structures extending through the tiers (e.g., extending vertically). The memory cells of different tiers can share the conductive structures of the data lines (e.g., vertical data lines). Some of the data lines can be coupled to each other.

The described memory device includes common conductive structures in addition to the conductive structures of the data lines. The common conductive structures can also extend through the tiers (e.g., extending vertically). The common conductive structures can be part of a ground connection (e.g., ground plate) of the memory device.

Improvements and benefits of the described memory device include improved device area efficiency, reduced capacitive coupling between adjacent data lines, and reduced total capacitance associated with the data lines. Further, the tier structure of the described memory device can also improve (e.g., reduce) cost per bit of the memory device. Other improvements and benefits of the described memory device and its variations are discussed below with reference to FIG. 1 through FIG. 7C.

Figure 1:
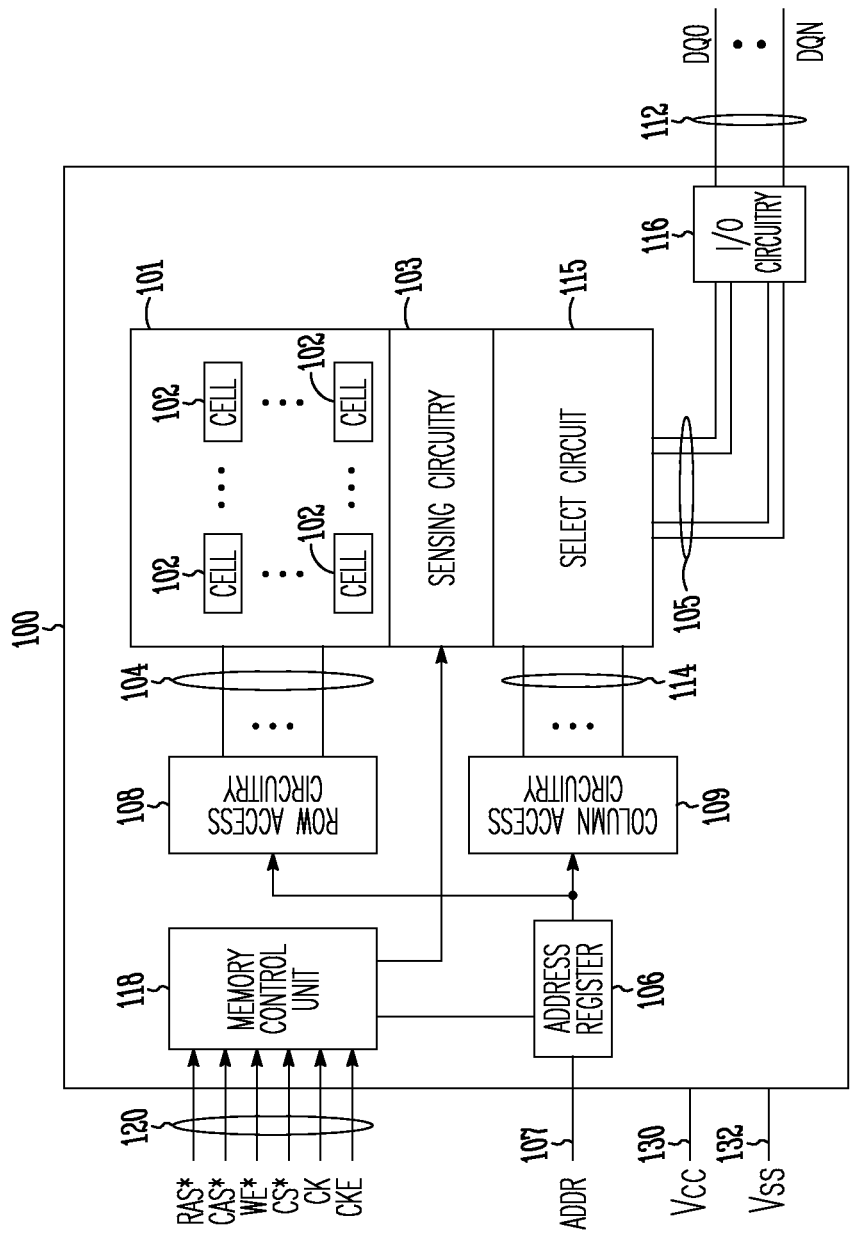
FIG. 1 shows a block diagram of an apparatus in the form of a memory device including volatile memory cells, according to some embodiments described herein.

FIG. 1 shows a block diagram of an apparatus in the form of a memory device 100 including volatile memory cells, according to some embodiments described herein. Memory device 100 includes a memory array 101, which can contain memory cells 102. Memory device 100 can include a volatile memory device such that memory cells 102 can be volatile memory cells. An example of memory device 100 includes a dynamic random-access memory (DRAM) device. Information stored in memory cells 102 of memory device 100 may be lost (e.g., invalid) if supply power (e.g., supply voltage Vcc) is disconnected from memory device 100. Hereinafter, supply voltage Vcc is referred to as representing some voltage levels; however, they are not limited to a supply voltage (e.g., Vcc) of the memory device (e.g., memory device 100). For example, if the memory device (e.g., memory device 100) has an internal voltage generator (not shown in FIG. 1) that generates an internal voltage based on supply voltage Vcc, such an internal voltage may be used instead of supply voltage Vcc.

In a physical structure of memory device 100, each of memory cells 102 can include transistors (e.g., two transistors) formed vertically (e.g., stacked on different layers) in different levels over a substrate (e.g., semiconductor substrate) of memory device 100. Memory device 100 can also include multiple levels (e.g., multiple tiers) of memory cells where one level (e.g., one tier) of memory cells can be formed over (e.g., stacked on) another level (e.g., another tier) of additional memory cells. The structure of memory array 101, including memory cells 102, can include the structure of memory arrays and memory cells described below with reference to FIG. 2 through FIG. 7C.

As shown in FIG. 1, memory device 100 can include access lines 104 (e.g., "word lines") and data lines (e.g., bit lines) 105. Memory device 100 can use signals (e.g., word line signals) on access lines 104 to access memory cells 102 and data lines 105 to provide information (e.g., data) to be stored in (e.g., written) or read (e.g., sensed) from memory cells 102.

Memory device 100 can include an address register 106 to receive address information ADDR (e.g., row address signals and column address signals) on lines 107 (e.g., address lines). Memory device 100 can include row access circuitry 108 (e.g., X-decoder) and column access circuitry 109 (e.g., Y-decoder) that can operate to decode address information ADDR from address register 106. Based on decoded address information, memory device 100 can determine which memory cells 102 are to be accessed during a memory operation. Memory device 100 can perform a write operation to store information in memory cells 102, and a read operation to read (e.g., sense) information (e.g., previously stored information) in memory cells 102. Memory device 100 can also perform an operation (e.g., a refresh operation) to refresh (e.g., to keep valid) the value of information stored in memory cells 102. Each of memory cells 102 can be configured to store information that can represent at most one bit (e.g., a single bit having a binary 0 ("0") or a binary 1 ("1"), or more than one bit (e.g., multiple bits having a combination of at least two binary bits).

Memory device 100 can receive a supply voltage, including supply voltages Vcc and Vss, on lines 130 and 132, respectively. Supply voltage Vss can operate at a ground potential (e.g., having a value of approximately zero volts). Supply voltage Vcc can include an external voltage supplied to memory device 100 from an external power source such as a battery or an alternating current to direct current (AC-DC) converter circuitry.

As shown in FIG. 1, memory device 100 can include a memory control unit 118, which includes circuitry (e.g., hardware components) to control memory operations (e.g., read and write operations) of memory device 100 based on control signals on lines (e.g., control lines) 120. Examples of signals on lines 120 include a row access strobe signal RAS*, a column access strobe signal CAS*, a write-enable signal WE*, a chip select signal CS*, a clock signal CK, and a clock-enable signal CKE. These signals can be part of signals provided to a DRAM device.

As shown in FIG. 1, memory device 100 can include lines (e.g., global data lines) 112 that can carry signals DQ0 through DQN. In a read operation, the value (e.g., "0" or "1") of information (read from memory cells 102) provided to lines 112 (in the form of signals DQ0 through DQN) can be based on the values of the signals on data lines 105. In a write operation, the value (e.g., "0" or "1") of information provided to data lines 105 (to be stored in memory cells 102) can be based on the values of signals DQ0 through DQN on lines 112.

Memory device 100 can include sensing circuitry 103, select circuitry 115, and input/output (I/O) circuitry 116. Column access circuitry 109 can selectively activate signals on lines (e.g., select lines) based on address signals ADDR. Select circuitry 115 can respond to the signals on lines 114 to select signals on data lines 105. The signals on data lines 105 can represent the values of information to be stored in memory cells 102 (e.g., during a write operation) or the values of information read (e.g., sensed) from memory cells 102 (e.g., during a read operation).

I/O circuitry 116 can operate to provide information read from memory cells 102 to lines 112 (e.g., during a read operation) and to provide information from lines 112 (e.g., provided by an external device) to data lines 105 to be stored in memory cells 102 (e.g., during a write operation). Lines 112 can include nodes within memory device 100 or pins (or solder balls) on a package where memory device 100 can reside. Other devices external to memory device 100 (e.g., a hardware memory controller or a hardware processor) can communicate with memory device 100 through lines 107, 112, and 120.

Memory device 100 may include other components, which are not shown in FIG. 1 so as not to obscure the example embodiments described herein. At least a portion of memory device 100 (e.g., a portion of memory array 101) can include structures and operations similar to or the same as any of the memory devices described below with reference to FIG. 2 through FIG. 28C.

Figure 2:
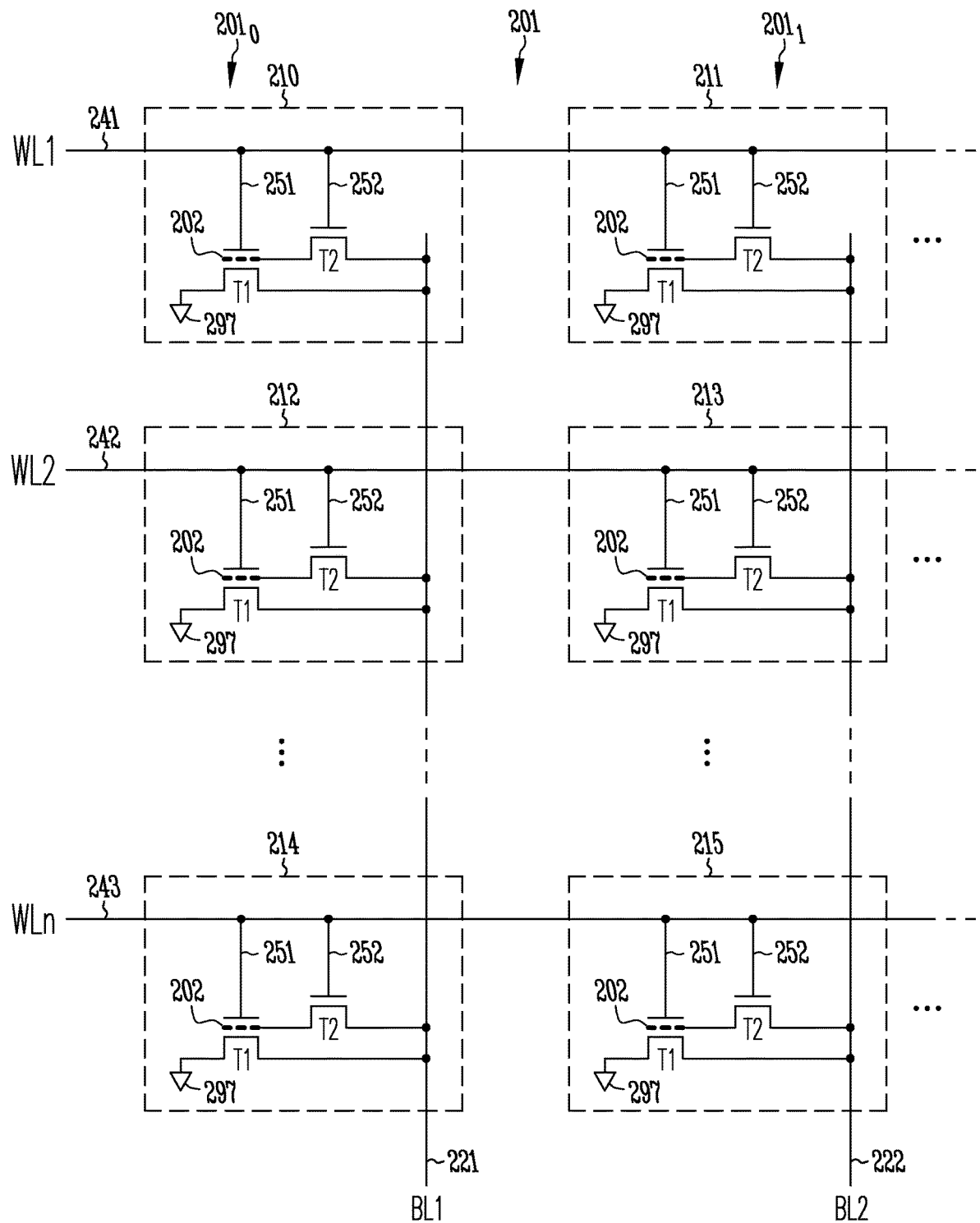
FIG. 2 shows a schematic diagram of a portion of a memory device including a memory array of two-transistor (2T) memory cells, according to some embodiments described herein.

FIG. 2 shows a schematic diagram of a portion of a memory device 200 including a memory array 201, according to some embodiments described herein. Memory device 200 can correspond to memory device 100 of FIG. 1. For example, memory array 201 can form part of memory array 101 of FIG. 1. As shown in FIG. 2, memory device 200 can include memory cells 210 through 215, which are volatile memory cells (e.g., DRAM cells). For simplicity, similar or identical elements among memory cells 210 through 215 are given the same labels.

Each of memory cells 210 through 215 can include two transistors T1 and T2. Thus, each of memory cells 210 through 215 can be called a 2T memory cell (e.g., 2T gain cell). Each of transistors T1 and T2 can include a field-effect transistor (FET). As an example, transistor T1 can be a p-channel FET (PFET), and transistor T2 can be an n-channel FET (NFET). Part of transistor T1 can include a structure of a p-channel metal-oxide semiconductor (PMOS) transistor. Thus, transistor T1 can include an operation similar to that of a PMOS transistor. Part of transistor T2 can include an n-channel metal-oxide semiconductor (NMOS). Thus, transistor T2 can include an operation similar to that of a NMOS transistor.

Transistor T1 of memory device 200 can include a charge-storage based structure (e.g., a floating-gate based). As shown in FIG. 2, each of memory cells 210 through 215 can include a charge storage structure 202, which can include the floating gate of transistor T1. Charge storage structure 202 can form the memory element of a respective memory cell among memory cells 210 through 215. Charge storage structure 202 can store charge. The value (e.g., "0" or "1") of information stored in a particular memory cell among memory cells 210 through 215 can be based on the amount of charge in charge storage structure 202 of that particular memory cell. For example, the value of information stored in a particular memory cell among memory cells 210 through 215 can be "0" or "1" (if each memory cell is configured as a single-bit memory cell) or "00", "01", "10", "11" (or other multi-bit values) if each memory cell is configured as a multi-bit memory cell.

As shown in FIG. 2, transistor T2 (e.g., the channel region of transistor T2) of a particular memory cell among memory cells 210 through 215 can be electrically coupled to (e.g., directly coupled to (contact)) charge storage structure 202 of that particular memory cell. Thus, a circuit path (e.g., current path) can be formed directly between transistor T2 of a particular memory cell and charge storage structure 202 of that particular memory cell during an operation (e.g., a write operation) of memory device 200. During a write operation of memory device 200, a circuit path (e.g., current path) can be formed between a respective data line (e.g., data line 221 or 222) and charge storage structure 202 of a particular memory cell through transistor T2 (e.g., through the channel region of transistor T2) of the particular memory cell.

Memory cells 210 through 215 can be arranged in memory cell groups $201_0$ and $201_1$. FIG. 2 shows two memory cell groups (e.g., $201_0$ and $201_1$) as an example. However, memory device 200 can include more than two memory cell groups. Memory cell groups $201_0$ and $201_1$ can include the same number of memory cells. For example, memory cell group $201_0$ can include memory cells 210, 212, and 214, and memory cell group $201_1$ can include memory cells 211, 213, and 215. FIG. 2 shows three memory cells in each of memory cell groups $201_0$ and $201_1$ as an example. The number of memory cells in memory cell groups $201_0$ and $201_1$ can be different from three.

Memory device 200 can perform a write operation to store information in memory cells 210 through 215, and a read operation to read (e.g., sense) information from memory cells 210 through 215. Memory device 200 can be configured to operate as a DRAM device. However, unlike some conventional DRAM devices that store information in a structure such as a container for a capacitor, memory device 200 can store information in the form of charge in charge storage structure 202 (which can be a floating gate structure). As mentioned above, charge storage structure 202 can be the floating gate of transistor T1. During an operation (e.g., a read or write operation) of memory device 200, an access line (e.g., a single access line) and a data line (e.g., a single data line) can be used to access a selected memory cell (e.g., target memory cell).

As shown in FIG. 2, memory device 200 can include access lines (e.g., word lines) 241, 242, and 243 that can carry respective signals (e.g., word line signals) WL1, WL2, and WLn. Access lines 241, 242, and 243 can be used to access both memory cell groups $201_0$ and $201_1$. In the physical structure of memory device 200, each of access lines 241, 242, and 243 can be structured as (can be formed from) at least one conductive line (one conductive line or multiple conductive lines where the multiple conductive lines can be electrically coupled (e.g., shorted) to each other).

Access lines 241, 242, and 243 can be selectively activated (e.g., activated one at a time) during an operation (e.g., read or write operation) of memory device 200 to access a selected memory cell (or selected memory cells) among memory cells 210 through 215. A selected memory cell can be referred to as a target memory cell. In a read operation, information can be read from a selected memory cell (or selected memory cells). In a write operation, information can be stored in a selected memory cell (or selected memory cells).

As shown in FIG. 2 transistors T1 and T2 can have gates 251 and 252, respectively. The gate (e.g., gate 251 or 252) of each of transistors T1 and T2 can be part of a respective access line (e.g., a respective word line). As shown in FIG. 2, the gate (e.g., gate 251 or 252) of each of transistors T1 and T2 of memory cell 210 can be part of access line 241. The gate (e.g., gate 251 or 252) of each of transistors T1 and T2 of memory cell 211 can be part of access line 241. For example, in the physical structure of memory device 200, four different portions of a conductive material (e.g., four different portions of continuous piece of metal or polysilicon) that forms access line 241 can form four gates that include gates 251 and 252 of respective transistors T1 and T2 of memory cell 210 and gates 251 and 252 of respective transistors T1 and T2 of memory cell 211.

The gate (e.g., gate 251 or 252) of each of transistors T1 and T2 of memory cell 212 can be part of access line 242. The gate (e.g., gate 251 or 252) of each of transistors T1 and T2 of memory cell 213 can be part of access line 242. For example, in the physical structure of memory device 200, four different portions of a conductive material (e.g., four different portions of a continuous piece of metal or polysilicon) that forms access line 242 can form four gates that include gates 251 and 252 of respective transistors T1 and T2 of memory cell 212 and gates 251 and 252 of respective transistors T1 and T2 of memory cell 213.

The gate (e.g., gate 251 or 252) of each of transistors T1 and T2 of memory cell 214 can be part of access line 243. The gate (e.g., gate 251 or 252) of each of transistors T1 and T2 of memory cell 215 can be part of access line 243. For example, in the physical structure of memory device 200, four different portions of a conductive material (e.g., four different portions of a continuous piece of metal or polysilicon) that forms access line 243 can form four gates that include gates 251 and 252 of respective transistors T1 and T2 of memory cell 214 and gates 251 and 252 of respective transistors T1 and T2 of memory cell 215.

In this description, a material can include a single material or a combination of multiple materials. A conductive material can include a single conductive material or a combination of multiple conductive materials.

Memory device 200 can include data lines (e.g., bit lines) 221 and 222 that can carry respective signals (e.g., bit line signals) BL1 and BL2. During a read operation, memory device 200 can use data line 221 to obtain information read (e.g., sensed) from a selected memory cell of memory cell group $201_0$, and data line 222 to read information from a selected memory cell of memory cell group $201_1$. During a write operation, memory device 200 can use data line 221 to provide information to be stored in a selected memory cell of memory cell group $201_0$, and data line 222 to provide information to be stored in a selected memory cell of memory cell group $201_1$.

Memory device 200 can include a ground connection (e.g., ground plate) 297 coupled to each of memory cells 210 through 215. Ground connection 297 can be structured from a conductive plate (e.g., a layer of conductive material) that can be coupled to a ground terminal of memory device 200.

As shown in FIG. 2, transistor T1 (e.g., the channel region of transistor T1) of a particular memory cell among memory cells 210 through 215 can be electrically coupled to (e.g., directly coupled to) ground connection 297 and electrically coupled to (e.g., directly coupled to) a respective data line (e.g., data line 221 or 222). Thus, a circuit path (e.g., current path) can be formed between a respective data line (e.g., data line 221 or 222) and ground connection 297 through transistor T1 of a selected memory cell during an operation (e.g., a read operation) performed on the selected memory cell.

Memory device 200 can include read paths (e.g., circuit paths). Information read from a selected memory cell during a read operation can be obtained through a read path coupled to the selected memory cell. In memory cell group $201_0$, a read path of a particular memory cell (e.g., memory cell 210, 212, or 214) can include a current path (e.g., read current path) through a channel region of transistor T1 of that particular memory cell, data line 221, and ground connection 297. In memory cell group $201_1$, a read path of a particular memory cell (e.g., memory cell 211, 213, or 215) can include a current path (e.g., read current path) through a channel region of transistor T1 of that particular memory cell, data line 222, and ground connection 297. In the example where transistor T1 is a PFET (e.g., a PMOS), the current in the read path (e.g., during a read operation) can include a hole conduction (e.g., hole conduction in the direction from data line 221 to ground connection 297 through the channel region (e.g., p-channel region) of transistor T1). Since transistor T1 can be used in a read path to read information from the respective memory cell during a read operation, transistor T1 can be called a read transistor and the channel region of transistor T1 can be called a read channel region.

Memory device 200 can include write paths (e.g., circuit paths). Information to be stored in a selected memory cell during a write operation can be provided to the selected memory cell through a write path coupled to the selected memory cell. In memory cell group $201_0$, a write path of a particular memory cell can include transistor T2 (e.g., can include a write current path through a channel region of transistor T2) of that particular memory cell and data line 221. In memory cell group $201_1$, a write path of a particular memory cell (e.g., memory cell 211, 213, or 215) can include transistor T2 (e.g., can include a write current path through a channel region of transistor T2) of that particular memory cell and data line 222. In the example where transistor T2 is an NFET (e.g., NMOS), the current in a write path (e.g., during a write operation) can include an electron conduction (e.g., electron conduction in the direction from data line 221 to charge storage structure 202) through the channel region (e.g., n-channel region) of transistor T2. Since transistor T2 can be used in a write path to store information in a respective memory cell during a write operation, transistor T2 can be called a write transistor and the channel region of transistor T2 can be called a write channel region.

Each of transistors T1 and T2 can have a threshold voltage (Vt). Transistor T1 has a threshold voltage Vt1. Transistor T2 has a threshold voltage Vt2. The values of threshold voltages Vt1 and Vt2 can be different (unequal values). For example, the value of threshold voltage Vt2 can be greater than the value of threshold voltage Vt1. The difference in values of threshold voltages Vt1 and Vt2 allows reading (e.g., sensing) of information stored in charge storage structure 202 in transistor T1 on the read path during a read operation without affecting (e.g., without turning on) transistor T2 on the write path (e.g., path through transistor T2). This can prevent leaking of charge (e.g., during a read operation) from charge storage structure 202 through transistor T2 of the write path.

In a structure of memory device 200, transistors T1 and T2 can be formed (e.g., engineered) such that threshold voltage Vt1 of transistor T1 can be less than zero volts (e.g., Vt1<0V) regardless of the value (e.g., "0" or "1") of information stored in charge storage structure 202 of transistor T1, and Vt1<Vt2. Charge storage structure 202 can be in state "0" when information having a value of "0" is stored in charge storage structure 202. Charge storage structure 202 can be in state "1" when information having a value of "1" is stored in charge storage structure 202. Thus, in this structure, the relationship between the values of threshold voltages Vt1 and Vt2 can be expressed as follows: Vt1 for state "0"<Vt1 for state "1"<0V, and Vt2=0V (or alternatively Vt2>0V).

In an alternative structure of memory device 200, transistors T1 and T2 can be formed (e.g., engineered) such that Vt1 for state "0"<Vt1 for state "1", where Vt1 for state "0"<0V (or alternatively Vt1 for state "0"=0V), Vt1 for state "1">0V, and Vt1<Vt2.

In another alternative structure, transistors T1 and T2 can be formed (e.g., engineered) such that Vt1 for state "0"<Vt1 for state "1", where Vt1 for state "0"=0V (or alternatively Vt1 for state "0">0V), and Vt1<Vt2.

During a read operation of memory device 200, only one memory cell of the same memory cell group can be selected one at a time to read information from the selected memory cell. For example, memory cells 210, 212, and 214 of memory cell group $201_0$ can be selected one at a time during a read operation to read information from the selected memory cell (e.g., one of memory cells 210, 212, and 214 in this example). In another example, memory cells 211, 213, and 215 of memory cell group $201_1$ can be selected one at a time during a read operation to read information from the selected memory cell (e.g., one of memory cells 211, 213, and 215 in this example).

During a read operation, memory cells of different memory cell groups (e.g., memory cell groups $201_0$ and $201_1$) that share the same access line (e.g., access line 241, 242, or 243) can be concurrently selected (or alternatively can be sequentially selected). For example, memory cells 210 and 211 can be concurrently selected during a read operation to read (e.g., concurrently read) information from memory cells 210 and 211. Memory cells 212 and 213 can be concurrently selected during a read operation to read (e.g., concurrently read) information from memory cells 212 and 213. Memory cells 214 and 215 can be concurrently selected during a read operation to read (e.g., concurrently read) information from memory cells 214 and 215.

The value of information read from the selected memory cell of memory cell group $201_0$ during a read operation can be determined based on the value of a current detected (e.g., sensed) from a read path (described above) that includes data line 221, transistor T1 of the selected memory cell (e.g., memory cell 210, 212, or 214), and ground connection 297. The value of information read from the selected memory cell of memory cell group $201_1$ during a read operation can be determined based on the value of a current detected (e.g., sensed) from a read path that includes data line 222, transistor T1 of the selected memory cell (e.g., memory cell 211, 213, or 215), and ground connection 297.

Memory device 200 can include detection circuitry (not shown) that can operate during a read operation to detect (e.g., sense) a current (e.g., current I1, not shown) on a read path that includes data line 221, and detect a current (e.g., current I2, not shown) on a read path that includes data line 222. The value of the detected current can be based on the value of information stored in the selected memory cell. For example, depending on the value of information stored in the selected memory cell of memory cell group $201_0$, the value of the detected current (e.g., the value of current I1) on data line 221 can be zero or greater than zero. Similarly, depending on the value of information stored in the selected memory cell of memory cell group $201_1$, the value of the detected current (e.g., the value of current I2) on data line 222 can be zero or greater than zero. Memory device 200 can include circuitry (not shown) to translate the value of a detected current into the value (e.g., "0", "1", or a combination of multi-bit values) of information stored in the selected memory cell.

During a write operation of memory device 200, only one memory cell of the same memory cell group can be selected at a time to store information in the selected memory cell. For example, memory cells 210, 212, and 214 of memory cell group $201_0$ can be selected one at a time during a write operation to store information in the selected memory cell (e.g., one of memory cell 210, 212, and 214 in this example). In another example, memory cells 211, 213, and 215 of memory cell group $201_1$ can be selected one at a time during a write operation to store information in the selected memory cell (e.g., one of memory cell 211, 213, and 215 in this example).

During a write operation, memory cells of different memory cell groups (e.g., memory cell groups $201_0$ and $201_1$) that share the same access line (e.g., access line 241, 242, or 243) can be concurrently selected. For example, memory cells 210 and 211 can be concurrently selected during a write operation to store (e.g., concurrently store) information in memory cells 210 and 211. Memory cells 212 and 213 can be concurrently selected during a write operation to store (e.g., concurrently store) information in memory cells 212 and 213. Memory cells 214 and 215 can be concurrently selected during a write operation to store (e.g., concurrently store) information in memory cells 214 and 215.

Information to be stored in a selected memory cell of memory cell group $201_0$ during a write operation can be provided through a write path (described above) that includes data line 221 and transistor T2 of the selected memory cell (e.g., memory cell 210, 212, or 214). Information to be stored in a selected memory cell of memory cell group $201_1$ during a write operation can be provided through a write path (described above) that includes data line 222 and transistor T2 of the selected memory cell (e.g., memory cell 211, 213, or 215). As described above, the value (e.g., binary value) of information stored in a particular memory cell among memory cells 210 through 215 can be based on the amount of charge in the charge storage structure 202 of that particular memory cell.

In a write operation, the amount of charge in the charge storage structure 202 of a selected memory cell can be changed (to reflect the value of information stored in the selected memory cell) by applying a voltage on a write path that includes transistor T2 of that particular memory cell and the data line (e.g., data line 221 or 222) coupled to that particular memory cell. For example, a voltage having one value (e.g., 0V) can be applied on data line 221 (e.g., provide 0V to signal BL1) if information to be stored in a selected memory cell among memory cells 210, 212, and 214 has one value (e.g., "0"). In another example, a voltage having another value (e.g., a positive voltage) can be applied on data line 221 (e.g., provide a positive voltage to signal BL1) if information to be stored in a selected memory cell among memory cells 210, 212, and 214 has another value (e.g., "1"). Thus, information can be stored (e.g., directly stored) in the charge storage structure 202 of a particular memory cell by providing the information to be stored (e.g., in the form of a voltage) on a write path (that includes transistor T2) of that particular memory cell.

Figure 3:
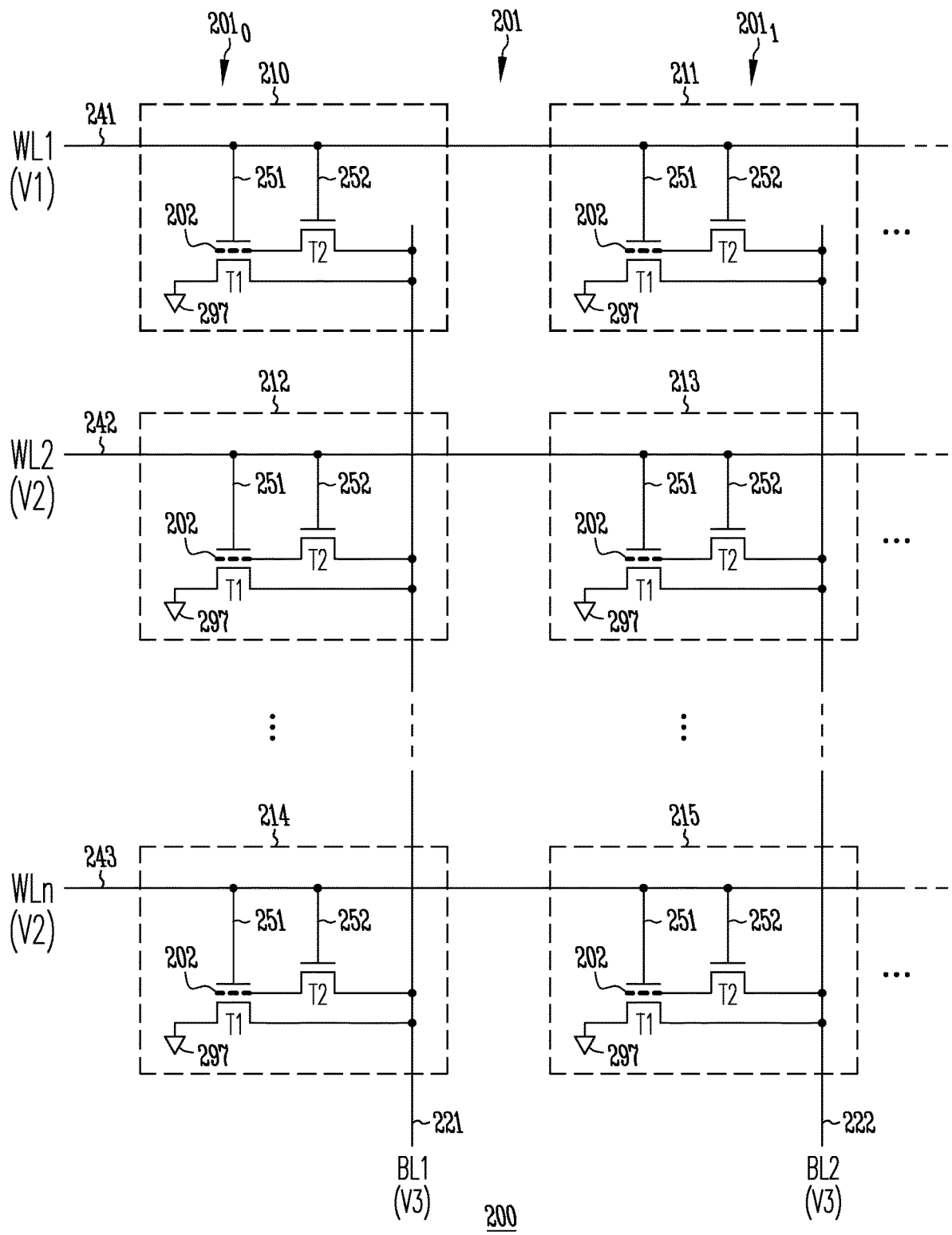
FIG. 3 shows the memory device of FIG. 2, including example voltages used during a read operation of the memory device, according to some embodiments described herein.

FIG. 3 shows memory device 200 of FIG. 2 including example voltages V1, V2, and V3 used during a read operation of memory device 200, according to some embodiments described herein. The example of FIG. 3 assumes that memory cells 210 and 211 are selected memory cells (e.g., target memory cells) during a read operation to read (e.g., to sense) information stored (e.g., previously stored) in memory cells 210 and 211. Memory cells 212 through 215 are assumed to be unselected memory cells. This means that memory cells 212 through 215 are not accessed, and information stored in memory cells 212 through 215 is not read while information is read from memory cells 210 and 211 in the example of FIG. 3. In this example, access line 241 can be called a selected access line (e.g., selected word line), which is the access line associated with (e.g., coupled to) selected memory cells (e.g., memory cells 210 and 211 in this example). In this example, access lines 242 and 243 can be called unselected access lines (e.g., unselected word line), which are the access lines associated with (e.g., coupled to) unselected memory cells (e.g., memory cells 212, 213, 214, and 215 in this example).

In FIG. 3, voltages V1, V2, and V3 can represent different voltages applied to respective access lines 241, 242, and 243 and data lines 221 and 222 during a read operation of memory device 200. Voltage V1 can be applied to the selected access line (e.g., access line 241). In a read operation, Voltage V2 can be applied to the unselected access lines (e.g., access lines 242 and 243).

Voltages V1, V2, and V3 can have different values. As an example, voltages V1, V2, and V3 can have values −1V, 0V, and 0.5V, respectively. The specific values of voltages used in this description are only example values. Different values may be used. For example, voltage V1 can have a negative value range (e.g., the value of voltage V1 can be from −3V to −1V).

In the read operation shown in FIG. 3, voltage V1 can have a value (voltage value) to turn on transistor T1 of each of memory cells 210 and 211 (selected memory cells in this example) and turn off (or keep off) transistor T2 of each of memory cells 210 and 211. This allows information to be read from memory cells 210 and 211. Voltage V2 can have a value, such that transistors T1 and T2 of each of memory cells 212 through 215 (unselected memory cells in this example) are turned off (e.g., kept off). Voltage V3 can have a value, such that a current (e.g., read current) may be formed on a read path that includes data line 221 and transistor T1 of memory cell 210, and a read path (a separate read path) that includes data line 222 and transistor T1 of memory cell 212. This allows a detection of current on the read paths (e.g., on respective data lines 221 and 222) coupled to memory cells 210 and 211, respectively. A detection circuitry (not shown) of memory device 200 can operate to translate the value of the detected current (during reading of information from the selected memory cells) into the value (e.g., "0", "1", or a combination of multi-bit values) of information read from the selected memory cell. In the example of FIG. 3, the value of the detected currents on data lines 221 and 222 can be translated into the values of information read from memory cells 210 and 211, respectively.

In the read operation shown in FIG. 3, the voltages applied to respective access lines 241, 242, and 243 can cause transistors T1 and T2 of each of memory cells 212 through 215, except transistor T1 of each of memory cells 210 and 211 (selected memory cells), to turn off (or to remain turned off). Transistor T1 of memory cell 210 (selected memory cell) may or may not turn on, depending on the value of the threshold voltage Vt1 of transistor T1 of memory cell 210. Transistor T1 of memory cell 211 (selected memory cell) may or may not turn on, depending on the value of the threshold voltage Vt1 of transistor T1 of memory cell 211. For example, if transistor T1 of each of memory cells (e.g., 210 through 215) of memory device 200 is configured (e.g., structured) such that the threshold voltage of transistor T1 is less than zero (e.g., Vt1<−1V) regardless of the value (e.g., the state) of information stored in a respective memory cell 210, then transistor T1 of memory cell 210, in this example, can turn on and conduct a current on data line 221 (through transistor T1 of memory cell 210). In this example, transistor T1 of memory cell 211 can also turn on and conduct a current on data line 222 (through transistor T1 of memory cell 211). Memory device 200 can determine the value of information stored in memory cells 210 and 211 based on the value of the currents on data lines 221 and 222, respectively. As described above, memory device 200 can include detection circuitry to measure the value of currents on data lines 221 and 222 during a read operation.

Figure 4:
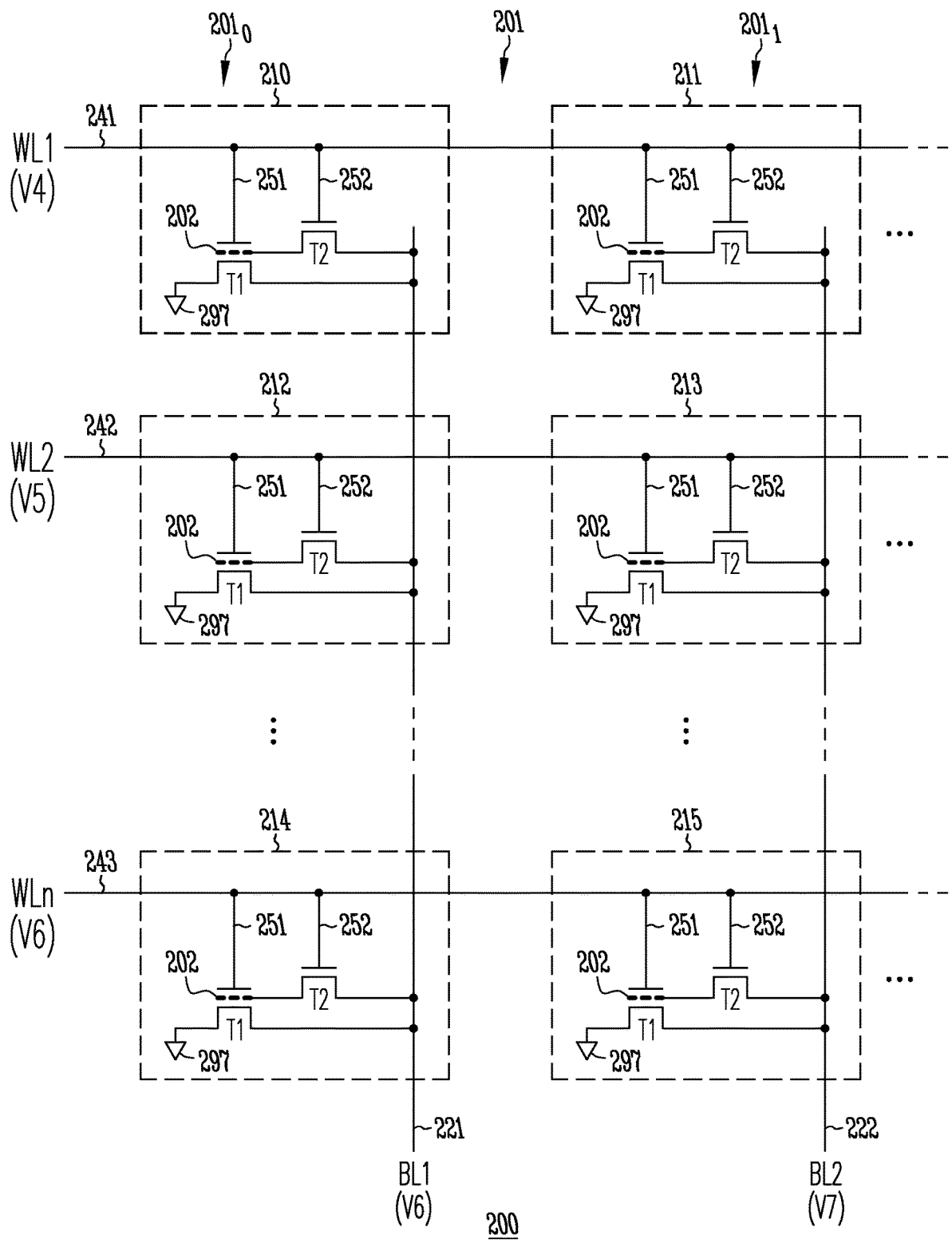
FIG. 4 shows the memory device of FIG. 2, including example voltages used during a write operation of the memory device, according to some embodiments described herein.

FIG. 4 shows memory device 200 of FIG. 2 including example voltages V4, V5, V6, and V7 used during a write operation of memory device 200, according to some embodiments described herein. The example of FIG. 4 assumes that memory cells 210 and 211 are selected memory cells (e.g., target memory cells) during a write operation to store information in memory cells 210 and 211. Memory cells 212 through 215 are assumed to be unselected memory cells. This means that memory cells 212 through 215 are not accessed and information is not to be stored in memory cells 212 through 215 while information is stored in memory cells 210 and 211 in the example of FIG. 4.

In FIG. 4, voltages V4, V5, V6, and V7 can represent different voltages applied to respective access lines 241, 242, and 243 and data lines 221 and 222 during a write operation of memory device 200. In a write operation, voltage V4 can be applied to the selected access line (e.g., access line 241). Voltage V5 can be applied to the unselected access lines (e.g., access lines 242 and 243).

Voltages V4, V5, V6, and V7 can have different values. As an example, voltages V4 and V5 can have values of 3V and 0V, respectively. These values are example values. Different values may be used.

The values of voltages V6 and V7 can be the same or different depending on the value (e.g., "0" or "1") of information to be stored in memory cells 210 and 211. For example, the values of voltages V6 and V7 can be the same (e.g., V6=V7) if the memory cells 210 and 211 are to store information having the same value. As an example, V6=V7=0V if information to be stored in each memory cell 210 and 211 is "0". In another example, V6=V7=V+ (e.g., V+ is a positive voltage (e.g., from 1V to 3V)) if information to be stored in each memory cell 210 and 211 is "1".

In another example, the values of voltages V6 and V7 can be different (e.g., V6≠V7) if the memory cells 210 and 211 are to store information having different values. As an example, V6=0V if "0" is to be stored in memory cell 210, and V7=V+ (e.g., V+ is a positive voltage (e.g., from 1V to 3V)) if "1" is to be stored in memory cell 211. As another example, V6=V+ (e.g., V+ is a positive voltage (e.g., from 1V to 3V)) if "1" is to be stored in memory cell 210, and V7=0V if "0" is to be stored in memory cell 211.

The range of voltage of 1V to 3V is used here as an example. A different range of voltages can be used. Further, instead of applying 0V (e.g., V6=0V or V7=0V) to a particular write data line (e.g., data line 221 or 222) for storing information having a value of "0" to the memory cell (e.g., memory cell 210 or 211) coupled to that particular write data line, a positive voltage (e.g., V6>0V or V7>0V) may be applied to that particular data line.

In a write operation of memory device 200 of FIG. 4, voltage V5 can have a value (e.g., V5=0V or V5<0V), such that transistors T1 and T2 of each of memory cells 212 through 215 (unselected memory cells, in this example) are turned off (e.g., kept off). Voltage V4 can have a value (e.g., V4>0V) to turn on transistor T2 of each of memory cells 210 and 211 (selected memory cells in this example) and form a write path between charge storage structure 202 of memory cell 210 and data line 221, and a write path between charge storage structure 202 of memory cell 211 and data line 222. A current (e.g., write current) may be formed between charge storage structure 202 of memory cell 210 (selected memory cell) and data line 221. This current can affect (e.g., change) the amount of charge on charge storage structure 202 of memory cell 210 to reflect the value of information to be stored in memory cell 210. A current (e.g., another write current) may be formed between charge storage structure 202 of memory cell 211 (selected memory cell) and data line 222. This current can affect (e.g., change) the amount of charge on charge storage structure 202 of memory cell 211 to reflect the value of information to be stored in memory cell 211.

In the example write operation of FIG. 4, the value of voltage V6 may cause charge storage structure 202 of memory cell 210 to discharge or to be charged, such that the resulting charge (e.g., charge remaining after the discharge or charge action) on charge storage structure 202 of memory cell 210 can reflect the value of information stored in memory cell 210. Similarly, the value of voltage V7 in this example may cause charge storage structure 202 of memory cell 211 to discharge or to be charged, such that the resulting charge (e.g., charge remaining after the discharge or charge action) on charge storage structure 202 of memory cell 211 can reflect the value of information stored in memory cell 211.

Figure 5:
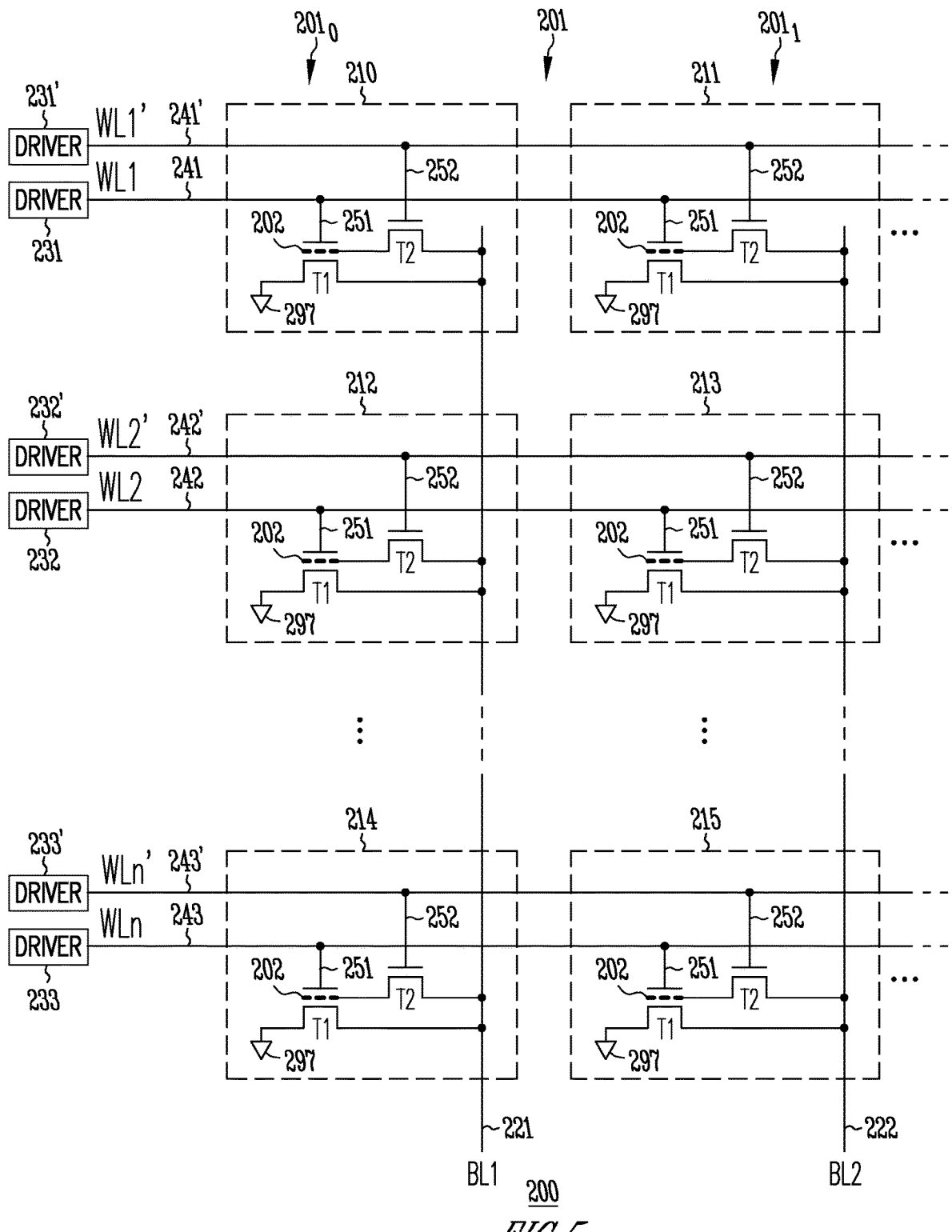
FIG. 5 shows the memory device of FIG. 2, including separate drivers coupled to access lines associated with a memory cell, according to some embodiments described herein.

FIG. 5 shows memory device 200 of FIG. 2, including separate access lines (e.g., separate word lines) for transistors T1 and T2 of each memory cell, according to some embodiments described herein. Memory device 200 of FIG. 5 can be a variation of memory device 200 of FIG. 2. As shown in FIG. 5, memory device 200 can include access lines (e.g., word lines) 241, 241', 242, 242', 243, and 243' that can carry respective signals (e.g., word line signals) WL1, WL1', WL2, WL2', WL3, and WL3'. Access lines 241, 241', 242, 242', 243, and 243' can be electrically separated from each other. Each memory cell can be associated with two access lines (e.g., read access line and write access line).

Access lines 241, 242, and 243 can be read access lines. Access lines 241, 242, and 243 can be used to selectively turn on a respective transistor T1 (e.g., read transistor) of a selected memory cell (or selected memory cells) during a read operation to read information from the selected memory cell (or selected memory cells). Access lines 241, 242, and 243 can also be used to turn off a respective transistor T1 of a selected memory cell (or selected memory cells) during a write operation performed on a selected memory cell (or selected memory cells).

Access lines 241', 242', and 243' can be called write access lines. Access lines 241', 242', and 243' can be used to selectively turn on a respective transistor T2 (e.g., write transistor) of a selected memory cell (or selected memory cells) during a write operation to store information in the selected memory cell (or selected memory cells). Access lines 241', 242', and 243' can also be used to turn off a respective transistor T2 of a selected memory cell (or selected memory cells) during a read operation performed on a selected memory cell (or selected memory cells).

As shown in FIG. 5, each of gates 251 and 252 of respective transistors T1 and T2 can be electrically coupled to a respective access line. In the structure of memory device 200 (see FIG. 6A through FIG. 7C), each of gates 251 and 252 can be formed from a portion (e.g., portion of the material) of a respective access line among access lines 241, 241', 242', 242, 243, and 243'. As described above, access lines (e.g., access lines 241 and 241') associated with a memory cell (e.g., memory cell 210) can be electrically separated from each other. Thus, gate 251 of transistor T1 and gate 252 of transistor T2 of a memory cell (e.g., memory cell 210) are also electrically separated from each other.

In memory device 200 of FIG. 2, gates 251 of different transistors T1 of memory cells associated with the same access line (e.g., a read access line) can be formed from different portions of the conductive material that forms that access line. Gates 252 of different transistors T2 of memory cells associated with the same access line (e.g., a write access line) can be formed from different portions of the conductive material that forms that access line.

For example, as shown in FIG. 2, gates 251 of respective transistors T1 of memory cells 210 and 211 can be formed from two respective portions of a conductive material (or materials) that forms access line 241. Gates 252 of respective transistors T2 of memory cells 210 and 211 can be formed from two respective portions of a conductive material (or materials) that forms access line 241'.

Gates 251 of respective transistors T1 of memory cells 212 and 213 can be formed from two respective portions of a conductive material (or materials) that forms access line 242. Gates 252 of respective transistors T2 of memory cells 212 and 213 can be formed from two respective portions of a conductive material (or materials) that forms access line 242'.

Gates 251 of respective transistors T1 of memory cells 214 and 215 can be formed from two respective portions of a conductive material (or materials) that forms access line 243. Gates 252 of respective transistors T2 of memory cells 214 and 215 can be formed from two respective portions of a conductive material (or materials) that forms access line 243'.

Access lines 241, 241', 242, 242', 243, and 243' can be used to access both memory cell groups $201_0$ and $201_1$. Each of access lines 241, 241', 242, 242', 243, and 243' can be structured as a conductive line, which can be driven (e.g., activated) by a separate driver (described below).

Memory device 200 can include drivers 231, 231', 232', 232, 233, and 233' coupled to access lines 241, 241', 242, 242', 243, and 243' respectively. Drivers 231, 232, and 233 can be called read drivers and can be used to selectively drive (e.g., activate) access lines 241, 242, and 243, respectively, during a read operation. Drivers 231', 232', and 233' can be called write drivers and can be used to selectively drive (e.g., activate) access lines 241', 242', and 243', respectively, during a write operation Drivers 231, 231', 232', 232, 233', and 233' can be coupled to access lines 241, 241', 242, 242', 243, and 243' respectively. Drivers can be complementary metal oxide semiconductor (CMOS) drivers or other types of drivers that can operate to provide (e.g., drive) signals WL1, WL1', WL2, WL2', WL3', and WL3' associated with access lines 241, 241', 242, 242', 243, and 243', respectively. Signals WL1, WL1', WL2, WL2', WL3', and WL3' can be provided (e.g., biased) with different voltages depending on which operation (e.g., read or write operation) memory device 200 performs.

Drivers 231, 231', 232', 232, 233', and 233' can be configured to drive access lines 241, 241', 242, 242', 243, and 243', respectively, one at a time during an operation (e.g., read or write operation) of memory device 200 to access a selected memory cell (or selected memory cells) among memory cells 210 through 215. A selected cell can be referred to as a target cell. In a read operation, information can be read from a selected memory cell (or selected memory cells). In a write operation, information can be stored in a selected memory cell (or selected memory cells).

In an operation (e.g., read or write performed on a selected memory cell, the drivers coupled to the access lines (selected access lines) associated with the selected memory cell can apply different voltages on the selected access lines (the conductive regions of the selected access lines). For example, during an operation (e.g., a read operation) of reading information from memory cell 210, driver 231 can apply a voltage on line 241 to turn on transistor T1 of memory cell 210, and driver 231' can apply another voltage on line 241' to turn off transistor T2 of memory cell 210. In another example, during an operation (e.g., a write operation) of storing information in memory cell 210, driver 231 can apply a voltage on line 241 to turn off transistor T1 of memory cell 210, and driver 231' can apply another voltage on line 241' to turn on transistor T2 of memory cell 210. Including separate drivers (e.g., drivers 231 and 231') for the access lines (e.g., access lines 241 and 241') associated with a memory cell (e.g., memory cell 210) can improve operation of memory device 200. For example, separate drivers can allow turning off (e.g., fully turning off) of either transistor T1 or T2 of a selected memory cell in a particular operation (e.g., read or write operation) to improve control of current (e.g., read current or write current) associated with the selected memory cell.

The structure of memory device 200 described above with reference to FIG. 2 through FIG. 5 is described below with reference to FIG. 6A through FIG. 7C.

For simplicity, detailed description of the same elements of memory device 200 is not repeated in the description of FIG. 6A through FIG. 7C. Some of the memory cells and associated data lines and access lines of memory device 200 schematically shown in FIG. 2 are not shown in FIG. 6A through FIG. 7C. FIG. 6A through FIG. 7C also show some of the memory cells and associated data lines and access lines of memory device 200 that are not schematically shown in FIG. 2. For simplicity and ease of viewing, cross-sectional lines (e.g., hatch lines) are omitted from most of the elements shown in FIG. 6A through FIG. 7C and other figures described herein. Some elements of memory device 200 may be omitted from a particular figure of the drawings so as to not obscure the description of the element (or elements) being described in that particular figure. The dimensions (e.g., physical structures) of the elements shown in the drawings described herein are not scaled.

FIG. 6A shows a structure of memory device 200 including a substrate 699 and tiers 601 and 602 located (e.g., stacked) on over another over substrate 699, according to some embodiments described herein. FIG. 6A shows two tiers 601 and 602 of memory device 200 as an example. However, memory device 200 includes numerous tiers (e.g., up to 100 tiers or more than 100 tiers).

Figure 6B:
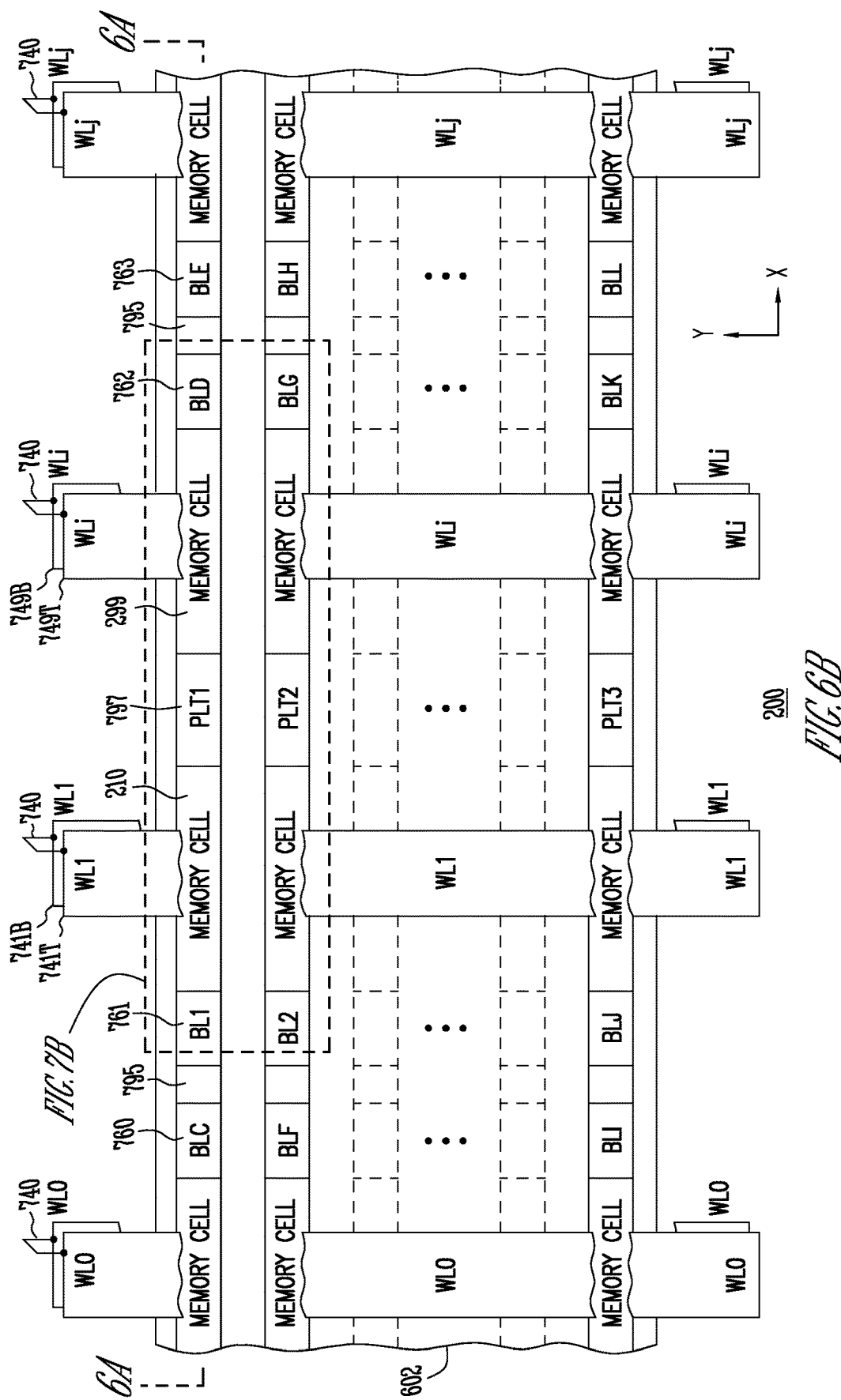
FIG. 6A through FIG. 7C show different views of a structure of the memory device of FIG. 2 through FIG. 5 including multiple tiers of memory cells, according to some embodiments described herein.

The X, Y, and Z directions shown in FIG. 6A can represent the directions corresponding to a three-dimensional (3-D) structure of memory device 200. For simplicity, FIG. 6A only shows the portion of memory device 200 with respect to the X-Z direction. The Z-direction (e.g., vertical direction) is a direction perpendicular to (e.g., outward from) substrate 699. The Z-direction is also perpendicular to (e.g., extended vertically from) the X-direction and the Y-direction. The X-direction and Y-direction are perpendicular to each other. A top view of memory device 200 in the X-Y directions (e.g., X-Y plan view) along line 6B-6B is shown in FIG. 6B. A portion labeled "FIG. 7A" in FIG. 6A is shown in detail in FIG. 7A.

In FIG. 6A, substrate 699 can be a semiconductor substrate (e.g., silicon-based substrate) or other types of substrates. As shown in FIG. 6A, each of tiers 601 and 602 can have its own memory cells (labeled "MEMORY CELL"). Thus, tiers 601 and 602 can be call memory cell tiers 601 and 602.

Each of tiers 601 and 602 can include its own access lines associated with the memory cells in the same tier. FIG. 6A shows access lines associated with signals WL0, WL1, WLi, WLj, and WL (also called "the access lines"). Memory cells of different tiers (e.g., tiers 601 and 602) may not share access lines. For example, the memory cells of tier 601 may not share access lines with the memory cells of tier 602. As shown in FIG. 6A, each memory cell can be between and adjacent (e.g., associated with) two respective portions of the access lines (e.g., a top and bottom access lines)). For example, memory cell 210 can be associated with two respective portions of the access lines associated with signals WL1. In another example, memory cell 299 can be associated with two respective portions of the access lines associated with signals WLi. Memory cell 299 is not schematically shown in FIG. 2.

As shown in FIG. 6A, memory device 200 can include data lines associated with signals BLA, BLB, BLC, BL1, BLD, and BLE (also called "the data lines" or data lines BLA, BLB, BLC, BL1, BLD, and BLE). A data line associated with signal BL1 can correspond to data line 221 (associated signal BL1) of FIG. 2. Each of the data lines can include a conductive structure. For simplicity, only conductive structures 760, 761, 762, and 763 of the data lines associated with signals BLC, BL1, BLD, and BLE are labeled in FIG. 6A. As shown in FIG. 6A, each of the data lines can have a length extending through the tiers (through tiers 601 and 602) in the Z-direction, which is a direction perpendicular to substrate 699. As shown in FIG. 6A, the Z-direction is also a direction from one tier to another tier (e.g., one horizontal tier to another horizontal tier). Thus, each of the data lines (and their respective conductive structures) of memory device 200 can have length in a direction from one tier to another tier (e.g., one horizontal tier to another horizontal tier).

Memory device 200 can include a dielectric portion (which includes a dielectric material) 795 between adjacent data lines (e.g., adjacent data lines BLC and BL1 and adjacent data lines BLD and BLE). FIG. 6A shows six data lines BLA, BLB, BLC, BL1, BLD, and BLE as example. The number of data lines of memory device 200 can vary.

As shown in FIG. 6A, memory device 200 can also include conductive lines (e.g., common conductive lines) associated with signals PLT0 and PLT1 (also called "the conductive lines"). Each of these conductive lines can include a respective conductive structure such as conductive structures 796 and 797. Each of conductive structures 796 and 979 can include a conductive material (e.g., conductively doped polysilicon, metal, or other conductive materials). Each of conductive structures 796 and 797 can be a common conductive structure between adjacent memory cells in the Z-direction (FIG. 6A) of different tiers (e.g., tiers 601 and 602) and between adjacent memory cells in the X-direction (FIG. 6B) of the same tier (e.g., tier 602). Each of conductive structures 796 and 797 of a respective conductive line (e.g., conductive line associated with signal PLT0 or PLT1) can be coupled to (or can be part of) ground connection (e.g., ground connection 297) of memory device 200. In an operation of memory device, signals PLT0 and PLT1 can be provided with 0V (e.g., ground potential). As shown in FIG. 6A, like data lines BLA, BLB, BLC, BL1, BLD, and BLE, conductive structure 797 of each of the conductive lines (associated with signals PLT0 and PLT1) can have a length extending through the tiers (through tiers 601 and 602) in the Z-direction.

FIG. 6B shows a top view (e.g., a cross-section) of the structure of memory device 200 along line 6B-6B of FIG. 6A including a portion of tier 602 of FIG. 6A. For simplicity, only some of the memory cells of tier 602 and some of the other data lines (e.g., data lines associated with signals BLF, BLG, BLH, BLI, BLJ, BLK, and BLL) of memory device 200 are shown in FIG. 6B. FIG. 6B also shows a top view of some memory cells of memory device 200 that are not shown in FIG. 6A. FIG. 6B also shows a top view of other conductive lines (e.g., common conductive lines) associated with signals PLT2 and PLT3. A side view of memory device 200 along line 6A-6A is shown in FIG. 6A (described above). A portion labeled "FIG. 7B" in FIG. 6A is shown in detail in FIG. 7B.

In FIG. 6B, the access lines associated with signals WL0, WL1, WLi, and WLj are shown in partial cut-away top view to show some portions of the underlying memory cells underlying these access lines. As shown in FIG. 6B, each of the access lines associated with signals WL0, WL1, WLi, and WLj can be a separate strip (e.g., strip of conductive material) having length in the Y-direction, which is perpendicular to the direction (e.g., the X-direction) from one memory to the next in the X-direction of the same tier (e.g., tier 602). The access lines associated with signals WL0, WL1, WLi, and WLj can be separated (electrically separated) from each other in the X-direction. As shown in FIG. 6B, the memory cells of the same tier (e.g., tier 602) can be arranged (spaced apart from each other) in the X-direction and arranged (spaced apart from each other) the Y-direction. The memory cells (e.g., neighbor memory cells) in the X-direction may not share an access line (e.g., may not share a word line). For example, memory cell 210 in FIG. 6B, which is a neighbor of (e.g., adjacent) memory cell 299 and is located at a distance from memory cell 299 in the X-direction, may not share the access line associated with signal WL1 with memory cell 299 in the X-direction.

Figure 6C:
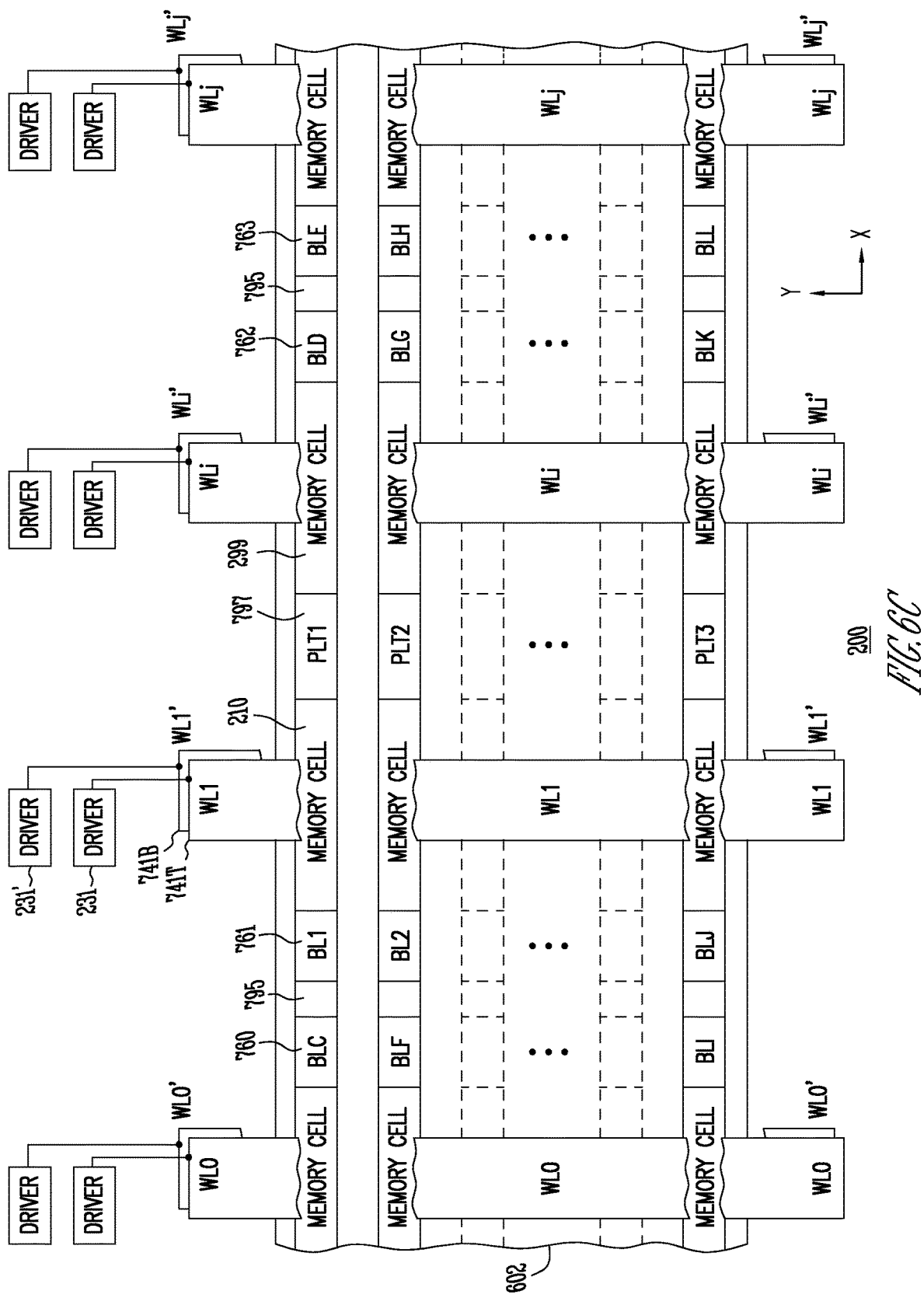

As shown in FIG. 6C, each memory cell can be adjacent and between two conductive regions (e.g., top and bottom conductive regions) of an access line. For example, the access line associated with signal WL1 can include a conductive region (e.g., top conductive region) 741T and a conductive region (e.g., bottom conductive region) 741B. Conductive regions 741T and 741B can be part of access line 241 (FIG. 2) of memory device 200. Conductive regions 741T and 741B are opposite from each other in the Z-direction. Conductive region 741T can be located over (e.g., on top) of memory cell 210 with respect to the top view (with respective to the Z-direction shown in FIG. 6A). Conductive region 741B can be located under (e.g., below) memory cell 210 with respect to the top view (with respective to the Z-direction shown in FIG. 6A). As shown in FIG. 6B, each of conductive region 741T and 741B can be structured as strip of conductive material electrically separated from adjacent conductive regions of other access lines (e.g., access lines associated with signals WL0, WLi, and WLj).

In another example, as shown in FIG. 6B, the access line associated with signal WLi can include a conductive region (e.g., top conductive region) 749T and a conductive region (e.g., bottom conductive region) 749B. Conductive regions 749T and 749B can be part of an access line associated with memory cell 299. As shown in FIG. 6B, each of conductive region 749T and 749B can be structured as a strip of conductive material electrically separated from adjacent conductive regions of other access lines (e.g., access lines associated with signals WL1, WLi, and WLj). Conductive regions 749T and 749B are opposite from each other in the Z-direction. Conductive region 749T can be located over (e.g., on top) of memory cell 299 with respect to the top view (with respect to the Z-direction shown in FIG. 6A). Conductive region 749B can be located under (e.g., below) memory cell 299 with respect to the top view (with respect to the Z-direction shown in FIG. 6A).

In the example of FIG. 6B, conductive regions 741T and 741B can be electrically coupled to each other by a connection 740. Connection 740 can include a conductive connection (which can include a conductive material (e.g., metal)). As shown in FIG. 6B, each of the other access lines (e.g., the access lines associated with signals WL0, WLi, and WLj) can also include top and bottom conductive regions, in which the top and bottom conductive regions can also be electrically coupled to each other by a respective connection 740.

FIG. 6C shows an example of a variation of memory device 200 of FIG. 6B in which conductive regions 741T and 741B are electrically separated from each other. Conductive regions 741T and 741B in FIG. C can be part of access lines 241 and 241', respectively, in FIG. 5. As shown in FIG. 6C, conductive regions 741T and 741B of the access line associated with signals WL1 and WL' can be coupled different drivers 231 and 231', respectively. Drivers 231 and 231' are the same as those shown in FIG. 2. As shown in FIG. 6C, conductive regions of other access lines (e.g., access lines associated with signals WL0, WL0', WLi, WLi', WLj, and WLj') can also be coupled different drivers.

Figure 6D:
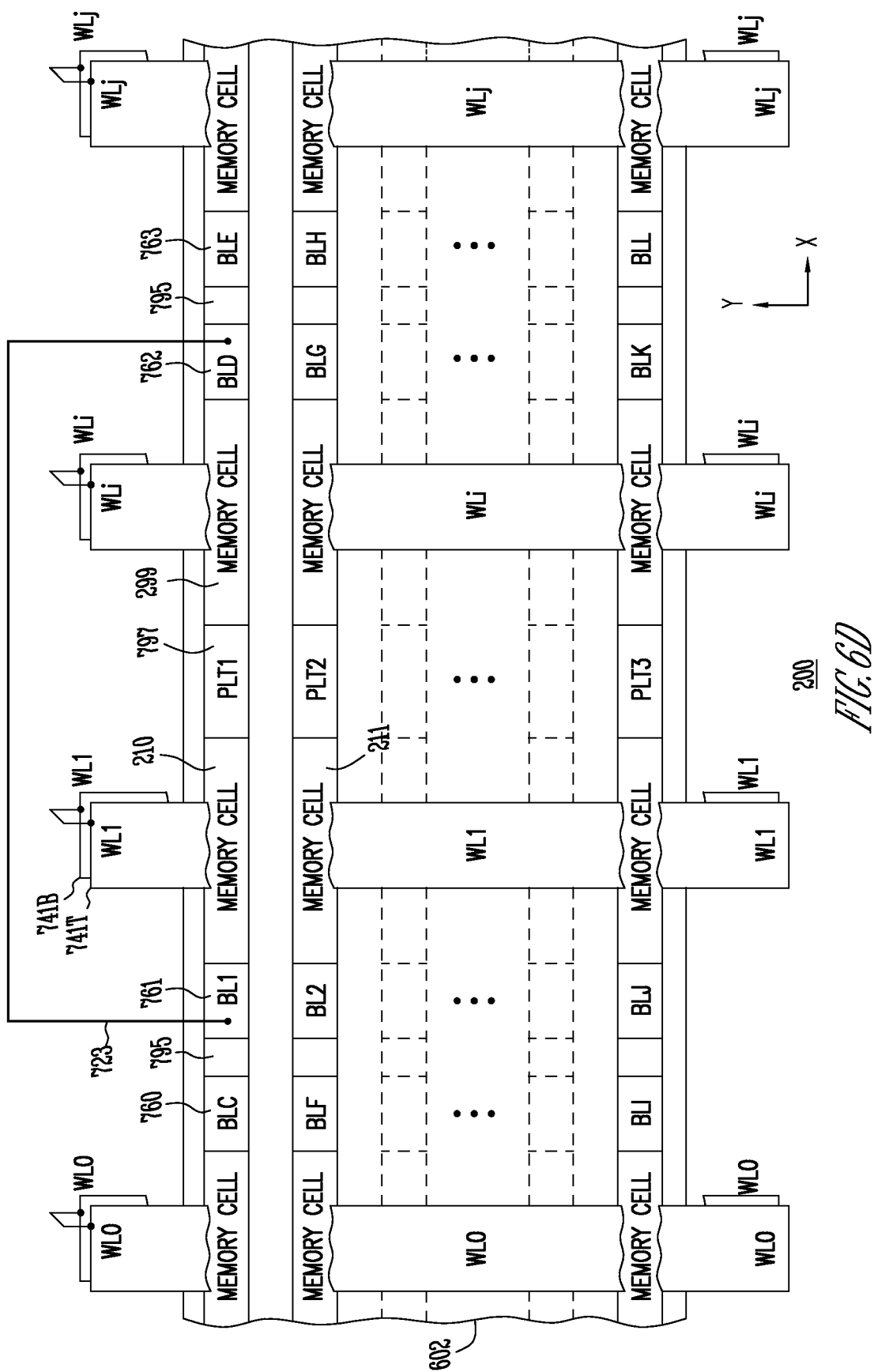

FIG. 6D shows an example of a variation of memory device 200 of FIG. 6B in which conductive regions of respective data lines can be electrically coupled to each other. For example, as shown in FIG. 6D, conductive structures 761 and 762 of respective the data lines (associated with signals BL1 and BLD) can be electrically coupled to each other through a connection 723. Conduction 723 can include a conductive connection (which can include a conductive material (e.g., metal)). FIG. 6D shows an example where two conductive regions of two respective the data lines are electrically coupled to each other. However, more than two conductive structures of more than two respective data lines (e.g., data lines that are coupled to memory cells having separate (independent) access lines) can be electrically coupled to each other. For example, one or both conductive structures 760 and 763 of respective data lines associated with signals BLC and BLE can also be electrically coupled to connection 723. In another example, any two or more of the conductive structures of the data lines associated with signals BLF, BL2, BLG, and BLH can also be electrically coupled to each other through a connection, which is similar to but different from (not electrically coupled to) connection 723. Electrically coupling multiple data lines, as described here, can improve (e.g., reduce) capacitive coupling between the data lines of memory device 200.

Figure 6E:
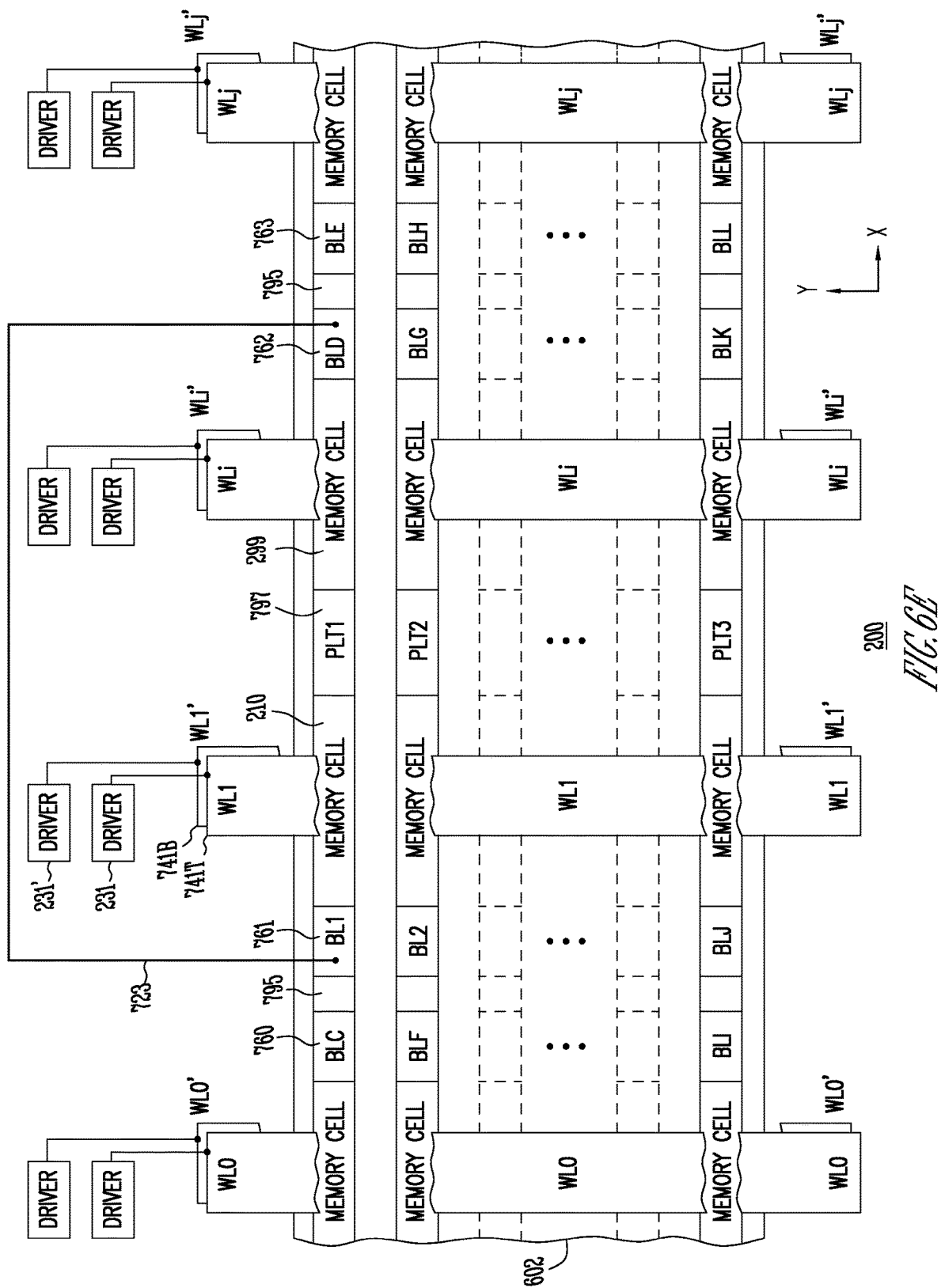

FIG. 6E shows an example of a variation of memory device 200 of FIG. 6C in which conductive regions of respective data lines can be electrically coupled to each other. Memory device 200 of FIG. 6E is the same as memory device 200 in FIG. 6C except that memory device 200 in FIG. 6E can include connection 723. Like the memory device 200 in FIG. 6D, two or more of the data lines of memory device 200 in FIG. 6E can be electrically coupled to each other.

Figure 7A:
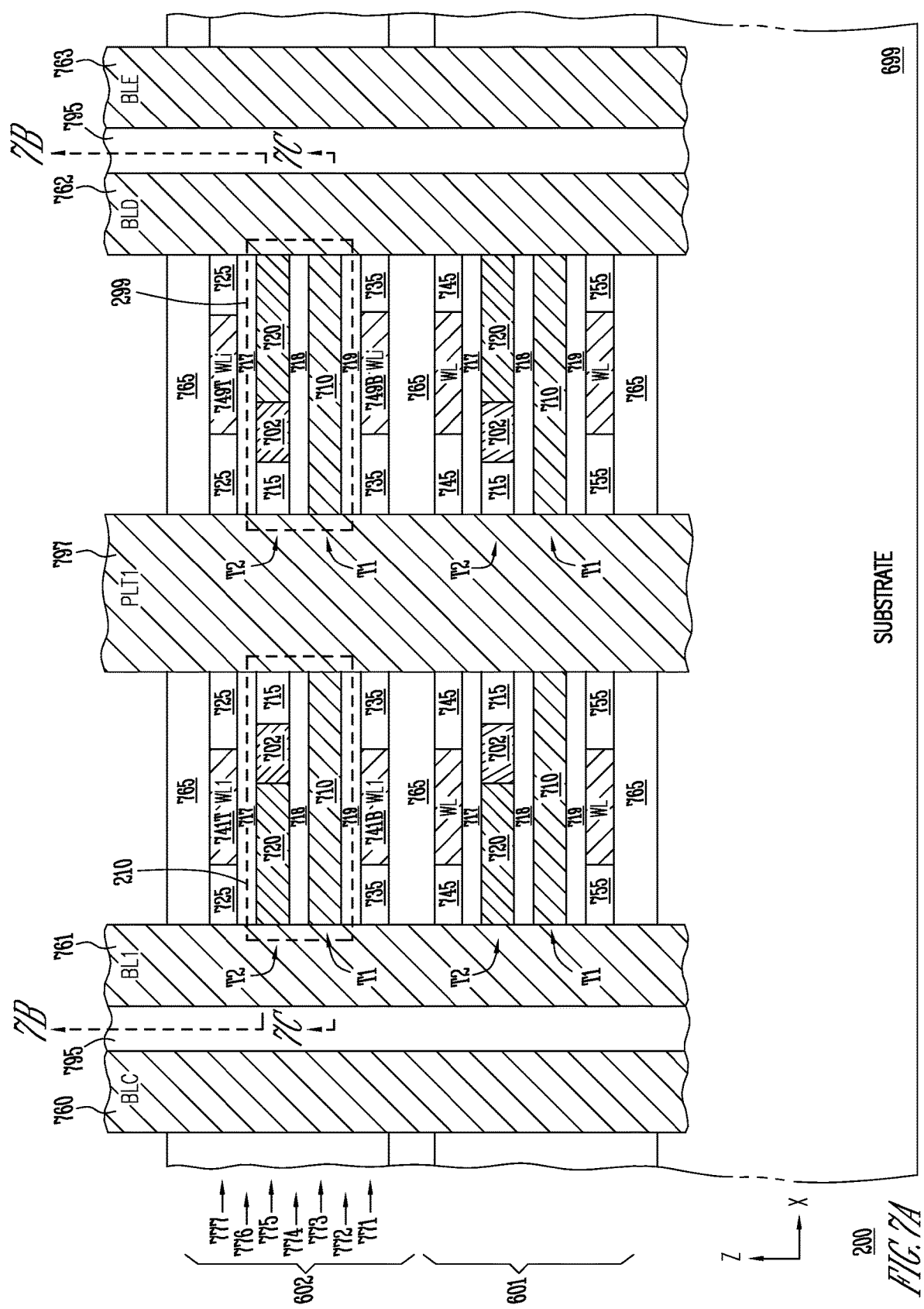

FIG. 7A shows a side view (e.g., a cross-section) of the portion labeled "FIG. 7A" of memory device 200 in FIG. 6A. FIG. 7B shows a top view of a portion of memory device 200 along line 7B-7B of FIG. 7A and the portion labeled "FIG. 7B" in FIG. 6B. FIG. 7C shows a top view of a portion of memory device 200 along line 7C-7C of FIG. 7A.

In FIG. 7A, FIG. 7B, and FIG. 7C, the same elements of memory cells 210 and 299 and other elements of memory device 200 are given the same labels. Thus, for simplicity, the following descriptions for the elements of memory cells 210 and 299 and other elements in FIG. 7A also refer to the same elements shown in FIG. 7B and FIG. 7C. Therefore, some of the elements in FIG. 7B and FIG. 7C are not described separately.

FIG. 7A shows details of cross-sections of tiers 601 and 602 of memory device 200. As shown in FIG. 7A, each of tiers 601 and 602 can have different levels (physical levels) located (stacked) one over another in the Z-direction over substrate 699. For example, tier 602 can include levels 771 through 777. For simplicity, the levels in tier 601 are not labeled.

Each of the data lines (associated with signals BLC, BL1, BLD, and BLE) can be formed from (e.g., can include) a conductive structure. FIG. 7A shows conductive structures 760, 761, 762, and 763 of data lines associated with signals BLC, BL1, BLD, and BLE, respectively. Each of conductive structures 760, 761, 762, and 763 can include a conductive material (e.g., conductively doped polysilicon, metal, or other conductive materials). As shown in FIG. 7A, each of conductive structures 760, 761, 762, and 763 can have a length extending through the tiers (through tiers 601 and 602) in the Z-direction, which is a direction perpendicular to substrate 699.

Conductive structures 760, 761, 762, and 763 can be electrically coupled to some of the elements (e.g., read and write channel regions of respective transistors T1 and T2, described below) of respective memory cells (e.g., memory cell 210 and 299) among the memory cells of tier 602. Each of conductive structures 760, 761, 762, and 763 are electrically separated from the access lines (e.g., access lines associated with signals WL1, WLi, and WL) of memory device 200 by respective dielectric portions (e.g., dielectric portions 725, 735, 745, and 755). Each of dielectric portions 725, 735, 745, and 755 can include a dielectric material (e.g., silicon dioxide or other dielectric materials).

For simplicity, the description of FIG. 7A describes the elements of tier 602. Tier 601 can have similar elements (which have similar or the same labels) as the elements of memory cell 210. As shown in FIG. 7A conductive region 741T and a conductive region 741B can be located on levels 777 and 771, respectively. Conductive regions 741T and 741B can collectively be part of (e.g., top and bottom conductive regions (or portions)) of access line 241 (FIG. 2). Alternatively, conductive regions 741T and 741B can part of access lines 241 and 241', respectively, of FIG. 5. Each of conductive regions 741T and 741B can include a conductive material (e.g., conductively doped polysilicon, metal, or other conductive materials).

Conductive region 741T can be electrically separated from conductive structure 761 of the data line associated with signal BL1 and conductive structure 797 of the conductive line (e.g., common conductive line) associated with signal PLT1 by respective dielectric portions 725. Conductive region 741B is electrically separated from conductive structures 761 and 797 by respective dielectric portions 735.

As shown in FIG. 7A, memory cell 299 adjacent memory cell 210 in the X-direction also includes conductive portions (as part of the access line associated with signals WLi) 749T and 749B located on levels 777 and 771, respectively, like conductive regions 741T and 741B, respectively.

In memory device 200, adjacent memory cells in the X-direction may not share an access line (e.g., a word line) or access lines. For example. memory cells 210 and 299 may not share an access line or access lines. Thus, conductive regions 741T and 749T (which are located on the same level 777) can be electrically separated from each other. For example, conductive regions 741T and 749T are not formed from (e.g., are included in) the same piece of conductive material. Similarly, conductive regions 741B and 749B (which are located on the same level 771) can be electrically separated from each other. For example, conductive regions 741B and 749B are not formed from (e.g., are not included in) the same piece of conductive material.

A shown in FIG. 7A, memory device 200 can include different dielectric portions located on different levels in the Z-direction to electrically separate the elements (in the Z-direction) within the same tier and to electrically separate one tier from another tier. For example, as shown in FIG. 7A, memory device 200 can include dielectric portions 717, 718, and 719 located on levels 772, 774, and 776, respectively. Dielectric portions 717, 718, and 719 can electrically separate (in the Z-direction) elements within tier 602. Memory device 200 can include dielectric portions 765 that can electrically separate (in the Z-direction) one tier from another tier.

Dielectric portions 717, 718, 719, and 765 can have the same dielectric material or different dielectric materials. Example materials for dielectric portions 717, 718, 719, and 765 include silicon oxide, silicon nitride, hafnium oxide (e.g., $HfO_2$), aluminum oxide (e.g., $Al_2O_3$), or other dielectric materials (e.g., other high-k dielectric materials).

Memory device 200 can include a charge storage structure 702 and a material 720 located on level 775. Material 720 can also be called portion 720. Material 720 is adjacent (e.g., contacts) charge storage structure 702 and electrically coupled to charge storage structure 702. Material 720 can also be electrically coupled to a respective conductive structure (e.g., conductive structure 761 or 762) of a respective data line (e.g., data line associated with signal BL1 or BLD). As shown in FIG. 7A, each of memory cells 210 and 299 (and two other memory cells located below memory cells 210 and 299) of memory device 200 can include transistor T2. Material 720 can form part of a channel region (e.g., write channel region) of transistor T2 of a respective memory cell (e.g., memory cell 210 or 299).

Material 720 (also called portion 720) of a particular memory cell (e.g., memory cell 210) can form a source (e.g., source terminal), a drain (e.g., drain terminal), or a channel region (e.g., write channel region) between the source and the drain of transistor T2 of that particular memory cell (e.g., memory cell 210). For example, as shown in FIG. 7A, the source, channel region, and the drain of transistor T2 of memory cell 210 can be formed from a single piece of the same material (or alternatively, a single piece of the same combination of materials) such as material 720. Therefore, the source, the drain, and the channel region of transistor T2 of memory cell 210 can be formed from the same material (e.g., material 720) of the same conductivity type (e.g., either n-type or p-type).

Material 720 (e.g., the write channel region of transistor T2) of a particular memory cell (e.g., memory cell 210) of memory device 200 can be part of a write path of that particular memory cell. For example, material 720 of memory cell 210 can be part of a write path of memory cell 210 that can carry a current (e.g., write current) during a write operation of storing information in memory cell 210. For example, during a write operation, to store information in memory cell 210 in FIG. 7A, material 720 of memory cell 210 can conduct a current (e.g., write current) between conductive structure 761 and charge storage structure 702 of memory cell 210. The direction of the write current can be from conductive structure 761 to charge storage structure 702 of memory device 200. In the example where transistor T2 is an NFET (e.g., a NMOS), the current (e.g., write current) can include an electron conduction (e.g., electron conduction in the direction from conductive structure 761 to charge storage structure 702 through material 720 (the channel region of transistor T2) of memory cell 210.

Materials 720 can include a structure (e.g., a piece (e.g., a layer)) of semiconductor material. In the example where transistor T2 is an NFET (as described above), material 720 can include n-type semiconductor material (e.g., n-type silicon).

In another example, the semiconductor material that forms material 720 can include a piece of oxide material. Examples of the oxide material used for materials 720 include semiconducting oxide materials, transparent conductive oxide materials, and other oxide materials.

As an example, material 720 can include at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide (TiOx), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), and gallium phosphide (GaP).

Using the material listed above in memory device 200 provides improvement and benefits for memory device 200. For example, during a read operation, to read information from a selected memory cell (e.g., memory cell 210), charge from charge storage structure 702 of the selected memory cell may leak to transistor T2 of the selected memory cell. Using the material listed above for the channel region (e.g., material 720) of transistor T2 can reduce or prevent such a leakage. This improves the accuracy of information read from the selected memory cell and improves the retention of information stored in the memory cells of the memory device (e.g., memory device 200) described herein.

The materials listed above are examples of material 720. However, other materials (e.g., a relatively high band-gap material) different from the above-listed materials can be used.

As shown in FIG. 7A, charge storage structure 702 is adjacent (e.g., contacts) material 720 and electrically coupled to material 720. Charge storage structure 702 can correspond to charge storage structure 202 of memory device 200 that is schematically shown in FIG. 2. As shown in FIG. 7A, charge storage structure 702 is electrically separated from conductive structure 797 of a respective conductive line (e.g., the conductive line associated with signal PLT1) by dielectric portion 715. Charge storage structure 702 can include a charge storage material (or a combination of materials), which can include a piece (e.g., a layer) of semiconductor material (e.g., polysilicon), a piece (e.g., a layer) of metal, or a piece of material (or materials) that can trap charge. The materials for charge storage structure 702 and conductive regions 741T, 741B, 749T, and 749B can be the same or can be different.

Memory device 200 can include a portion 710 on level 773. Portion 710 is adjacent one side (e.g., bottom side) of dielectric portion 718 and separated from portion 720 and charge storage structure 702 by dielectric portion 718. Portion 720 and charge storage structure 702 are adjacent another side (e.g., top side) of dielectric portion 718 and separated from portion 710 by dielectric portion 718. Portion 710 can be electrically coupled to conductive structure 797. Portion 710 can also be electrically coupled to one of conductive structures 761 and 762 of a respective data line (the data line associated with signal BL1 or BLD). As shown in FIG. 7A, each of memory cells 210 and 299 (and two other memory cells located below memory cells 210 and 299) can include transistor T1. Portion 710 can form part of a channel region (e.g., read channel region) of transistor T1 of a respective memory cell (e.g., memory cell 210 or 299).

Portion 710 of a particular memory cell (e.g., memory cell 210) can form a source (e.g., source terminal), a drain (e.g., drain terminal), or a channel region (e.g., write channel region) between the source and the drain of transistor T1 of that particular memory cell (e.g., memory cell 210). For example, as shown in FIG. 7A, the source, channel region, and the drain of transistor T1 of memory cell 210 can be formed from a single piece of the same material (or alternatively, a single piece of the same combination of materials) such as material 710. Therefore, the source, the drain, and the channel region of transistor T1 of memory cell 210 can be formed from the same material (e.g., the material of portion 710) of the same conductivity type (e.g., either n-type or p-type).

Portion 710 can include a semiconductor material. Example materials for portion 710 include silicon, polysilicon (e.g., undoped or doped polysilicon), germanium, silicon-germanium, or other semiconductor materials, and semiconducting oxide materials (oxide semiconductors, e.g., SnO or other oxide semiconductors). The semiconductor material of portion 710 and the semiconductor material of portion 720 (material 720) can have different conductivity types (e.g., n-type conductivity and p-type conductivity). Alternatively, the semiconductor material of portion 710 and the semiconductor material of portion 720 (material 720) can have the same conductivity type (e.g., n-type conductivity or p-type conductivity).

Portion 710 (e.g., the read channel region of transistor T1) of a particular memory cell (e.g., memory cell 210) of memory device 200 can be part of a read path of that particular memory cell. For example, portion 710 of memory cell 210 can be part of a read path of memory cell 210 that can carry a current (e.g., read current) during a read operation of reading information from memory cell 210. For example, during a read operation, to read information from memory cell 210 in FIG. 7A, portion 710 of memory cell 210 can conduct a current (e.g., read current) between conductive structure 761 and conductive structure 797 (e.g., part of ground connection). The direction of the read current can be from conductive structure 761 and conductive structure 797 through portion 710. In the example where transistor T1 is a PFET (e.g., a PMOS), the current (e.g., read current) can include a hole conduction (e.g., hole conduction in the direction from conductive structure 761 to conductive structure 797 through portion 710 (the channel region of transistor T1)) of memory cell 210.

In the example where transistor T1 is a PFET and transistor T2 is an NFET, the material that forms portion 710 can have a different conductivity type from material 720. For example, portion 710 can include p-type semiconductor material (e.g., p-type silicon) regions, and material 720 can include n-type semiconductor material (e.g., n-type gallium phosphide (GaP)) regions.

As shown in FIG. 7A, conductive region 741B can be opposite (in the Z-direction) portion 710 of transistor T1 of memory cell 210 and can form a gate of transistor T1 of memory cell 210. Conductive region 741T can be opposite (in the Z-direction) portion 720 and charge storage structure 702 of memory cell 210 and can form a gate of transistor T2 of memory cell 210. Thus, the same signal (e.g., WL1) can be used to control (e.g., turn on or turn off) transistors T1 and T2 of memory cell 210 in a structure (e.g., FIG. 6B) where conductive regions 741T and 741B can be electrically coupled (e.g., short) to each other (e.g., coupled to each other by a respective connection 740 in FIG. 6B). Alternatively, different signals (e.g., signals WL1 and WL1' in FIG. 6C) can be used and separately provided to conductive regions 741T and 741B to separately control transistors T1 and T2 of memory cell 210.

As shown in FIG. 7A, conductive region 749B can be opposite (in the Z-direction) portion 710 of transistor T1 of memory cell 299 can form a gate of transistor T1 of memory cell 299. Conductive region 749T can be opposite (in the Z-direction) portion 720 and charge storage structure 702 of memory cell 299 can form a gate of transistor T1 of memory cell 299. Thus, the same signal (e.g., WLi) can be used to control (e.g., turn on or turn off) transistors T1 and T2 of memory cell 299 in a structure (e.g., FIG. 6B) where conductive regions 749T and 749B can be electrically coupled (e.g., short) to each other (e.g., coupled to each other by a respective connection 740 in FIG. 6B). Alternatively, different signals (e.g., signals WLi and WLi' in FIG. 6C) can be used and separately provided to conductive regions 749T and 749B to separately control transistors T1 and T2 of memory cell 299.

As shown in FIG. 7A, the memory cells (e.g., memory cell 210, 299, and two memory cells (not labeled) located below memory cells 210 and 299) of memory device 200 have similar or the same structure. Thus, for simplicity, detailed description of memory cells 299 and other memory cells are omitted.

The description above with reference to FIG. 6A through FIG. 7C show that the elements (e.g., the memory cells and the access lines) can be arranged (e.g., formed) in different tiers in memory device 200. This can allow multiple tiers (e.g., tiers 601 and 602 and similar tiers) of memory device 200 to be formed together. Thus, the cost (e.g., cost per bit) of forming memory device 200 can be reduced. Further, the length of the conductive structures of the data lines can be based on the number of tiers. The tier structure and the memory cell structure of the memory cells of memory device 200 (as shown in FIG. 7A) can have a relatively compact size (e.g., including a relatively small (e.g., thin) dimension in the Z-direction of each memory cell). This can improve (e.g., increase) area efficiency of the memory device in comparison with some similar memory devices. The compact size (e.g., relatively small memory cell dimension in the Z-direction) can also improve (e.g., shorten) the length (e.g., vertical length in Z-direction) of the data lines of memory device 200. This can reduce coupling capacitance between data lines of memory device 200 and total capacitance of the data lines. Reduction of these capacitances can lead to improved operations of memory device 200.

The illustrations of apparatuses (e.g., memory devices 100 and 200) and methods (e.g., operations of memory devices 100 and 200) are intended to provide a general understanding of the structure of various embodiments and are not intended to provide a complete description of all the elements and features of apparatuses that might make use of the structures described herein. An apparatus herein refers to, for example, either a device (e.g., any of memory devices 100 and 200) or a system (e.g., an electronic item that can include any of memory devices 100 and 200).

Any of the components described above with reference to FIG. 1 through FIG. 7C can be implemented in a number of ways, including simulation via software. Thus, apparatuses (e.g., memory devices 100 and 200) or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The memory devices (e.g., memory devices 100 and 200) described herein may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 7C include apparatuses and methods of using the apparatuses. One of the apparatuses includes first, second, and third conductive structures, each having a length in a first direction, first and second memory cells spaced apart from each other in a second direction perpendicular to the first direction, first conductive regions, and second conductive regions. Each of the first and second memory cells includes a first semiconductor portion located on a first level of the apparatus and coupled to the third conductive structure and one of the first and second conductive structures, a second semiconductor portion located on a second level of the apparatus and coupled to one of the first and second conductive structures. The first conductive regions are opposite the first and second semiconductor portions, respectively, of the first memory cell. Second conductive regions are opposite the first and second semiconductor portions, respectively, of the second memory cell. Other embodiments, including additional apparatuses and methods, are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, the terms "first", "second", and "third," etc. are used merely as labels, and are not intended to impose numerical requirements on their objects.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
   a first conductive structure, a second conductive structure, and a third conductive structure, each of the first, second, and third conductive structures having a length in a first direction;
   a first memory cell and a second memory cell located at a distance from the first memory cell in a second direction perpendicular to the first direction, each of the first and second memory cells including:
     a first semiconductor portion located on a first level of the apparatus and coupled to the third conductive structure and one of the first and second conductive structures; and
     a second semiconductor portion located on a second level of the apparatus and coupled to one of the first and second conductive structures;
   a first conductive region located on a third level of the apparatus and opposite the first semiconductor portion of the first memory cell;
   a first additional conductive region located on a fourth level of the apparatus and opposite the second semiconductor portion of the first memory cell;
   a second conductive region located on the third level and opposite the first semiconductor portion of the second memory cell, the second conductive region electrically separated from the first conducive region; and
   a second additional conductive region located on the fourth level and opposite the second semiconductor portion of the second memory cell, the second additional conductive region electrically separated from the first additional conducive region.

2. The apparatus of claim 1, wherein each of the first conductive region, first additional conductive region, second conductive region, and second additional conductive regions has a length in a third direction perpendicular to a direction from the first memory cell to the second memory cell.

3. The apparatus of claim 1, wherein:
the first conductive region and the first additional conductive region are electrically coupled to each other; and
the second conductive region and the second additional conductive region are electrically coupled to each other.

4. The apparatus of claim 1, wherein:
the first conductive structure is part of a first data line of the apparatus; and
the second conductive structure is part of a second data line of the apparatus.

5. The apparatus of claim 1, wherein the third conductive structure is part of a ground connection of the apparatus.

6. The apparatus of claim 1, wherein:
the first conductive region is part of a first word line of the apparatus; and
the second conductive region is part of a second word line of the apparatus.

7. The apparatus of claim 1, wherein:
the first additional conductive region is part of a first word line of the apparatus; and
the second additional conductive region is part of a second word line of the apparatus.

8. The apparatus of claim 1, wherein the first and second semiconductor portion have different conductivity types.

9. The apparatus of claim 1, wherein the first and second semiconductor portion have a same conductivity type.

10. The apparatus of claim 1, wherein the second semiconductor portion includes a semiconducting oxide material.

11. An apparatus comprising:
a first conductive structure;
a second conductive structure, each of the first and second conductive structures having a length in a first direction;
a memory cell including:
a first channel region located on a first level of the apparatus and coupled to the first and second conductive structures; and
a second channel region located on a second level of the apparatus and coupled to the first conductive structure;
a first conductive region located on a third level of the apparatus and opposite the first channel region; and
a first additional conductive region located on a fourth level of the apparatus and opposite the second channel region, wherein the first additional conductive portion is electrically separated from the first conducive region, and each of the first conductive region and the first additional conductive region has a length in a second direction.

12. The apparatus of claim 11, wherein the first conductive structure is part of a data line of the apparatus, and the second conductive structure is part of a ground plate of the apparatus.

13. The apparatus of claim 11, wherein the first channel region includes a first semiconductor material having a first conductivity type, and the second channel region includes a second semiconductor material having a second conductivity type.

14. The apparatus of claim 11, wherein the first channel region includes a first semiconductor material having p-type conductivity, and the second channel region includes a second semiconductor material having n-type conductivity.

15. The apparatus of claim 11, wherein the second channel region includes at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide (TiOx), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_2O_a$), tin indium zinc oxide ($Sn_xIn_yZn_zO_a$), aluminum tin indium zinc oxide ($Al_xSn_yIn_zZn_aO_a$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), and gallium phosphide (GaP).

16. The apparatus of claim 11, further comprising:
a first driver coupled to the first additional conductive region; and
a second driver coupled to the second additional conductive region.

17. The apparatus of claim 11, further comprising:
a first driver to apply a first voltage to the first additional conductive region in an operation performed on the memory cell; and
a second driver apply a second voltage to the second additional conductive region in the operation performed on the memory cell.

18. An apparatus comprising:
a first data line, a second data line coupled to the first data line, and a conductive line between the first and second data line;
a first memory cell including:
a first channel region located on a first level of the apparatus and coupled to the first data line and the conductive line; and
a second channel region located on a second level of the apparatus and coupled to the first data line;
a second memory cell adjacent the first memory cell in a direction perpendicular to a direction of a length of the conductive line, the second memory cell including:
a third channel region located on the first level and coupled to the second data line and the conductive line; and
a fourth channel region located on the second level and coupled to the second data line.

19. The apparatus of claim 18, further comprising:
a first conductive region located on a third level of the apparatus and opposite the first channel region of the first memory cell;
a first additional conductive region located on a fourth level of the apparatus and opposite the second channel region of the first memory cell;
a second conductive region located on the third level and opposite the third channel region of the second memory cell, the second conductive region electrically separated from the first conductive region; and
a second additional conductive region located on the fourth level and opposite the fourth channel region of the second memory cell, the second additional conductive region electrically separated from the first additional conductive region.

20. The apparatus of claim 19, wherein each of the first conductive region, first additional conductive region, second conductive region, and second additional conductive regions has a length in a direction perpendicular to a direction from the first memory cell to the second memory cell.

21. The apparatus of claim 19, wherein:
the first additional conductive region is electrically coupled to the first conductive region; and
the second additional conductive region is electrically coupled to the second conductive region.

22. An apparatus comprising:
tiers located one over another, each of the tier including memory cells;
a first data line, a second data line, and a conductive line, each of the conductive line and the first and second data lines including a conductive structure, the conductive structure extending through the tiers;
a first memory cell and a second memory cell included in the memory cells of one of the tiers, the first memory cell located at a distance from the second memory first in a direction perpendicular to a direction from one tier to another tier, each of the first and second memory cells including:
a first transistor coupled to the conductive line and one of the first and second data lines; and
a second transistor coupled to one of the first and second data lines;
a first conductive region opposite a portion of the first transistor of the first memory cell;
a first additional conductive region opposite a portion of the second transistor of the first memory cell;
a second conductive region opposite a portion of the first transistor of the second memory cell and electrically separated from the first conductive region; and
a second additional conductive region opposite a portion of the second transistor of the second memory cell and electrically separated from the first additional conductive region, wherein each of the first conductive region, the first additional conductive region, the second conductive region, and the second additional conductive region has a length in a direction perpendicular to a direction from the first memory cell to the second memory cell.

23. The apparatus of claim 22, wherein:
the portion of the first transistor of the first memory cell includes a channel region of the first transistor of the first memory cell;
the portion of the second transistor of the first memory cell includes a channel region of the second transistor of the first memory cell;
the portion of the first transistor of the second memory cell includes a channel region of the first transistor of the second memory cell; and
the portion of the second transistor of the second memory cell includes a channel region of the second transistor of the second memory cell.

24. The apparatus of claim 22, wherein:
the portion of the first transistor of the first memory cell includes a charge storage structure of first memory cell; and
the portion of the first transistor of the second memory cell includes a charge storage structure of the second memory cell.

25. The apparatus of claim 22, wherein the first conductive region is electrically coupled to the first additional conductive region, and the second conductive region is electrically coupled to the second additional conductive region.

26. The apparatus of claim 22, wherein the first conductive region is electrically separated from the first additional conductive region, and the second conductive region is electrically separated from the second additional conductive region.

27. The apparatus of claim 22, wherein the first data line is coupled to the second data line.

28. The apparatus of claim 22, wherein the conductive line is part of a ground connection of the apparatus.

29. The apparatus of claim 22, further comprising:
a first driver to turn on the first transistor of the first memory cell during an operation of reading information from the first memory cell; and
a second driver to turn off the second transistor of the first memory cell during the operation of reading information from the first memory cell.

30. The apparatus of claim 22, further comprising:
a first driver to turn off the first transistor of the first memory cell during an operation of storing information in the first memory cell; and
a second driver to turn on the second transistor of the first memory cell during the operation of storing information in the first memory cell.

* * * * *